(12) United States Patent
Ohori

(10) Patent No.: US 11,543,716 B2
(45) Date of Patent: Jan. 3, 2023

(54) ELECTRO-OPTICAL DEVICE AND ELECTRONIC DEVICE

(71) Applicant: SEIKO EPSON CORPORATION, Tokyo (JP)

(72) Inventor: Mitsutaka Ohori, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/356,557

(22) Filed: Jun. 24, 2021

(65) Prior Publication Data
US 2021/0405474 A1 Dec. 30, 2021

(30) Foreign Application Priority Data
Jun. 26, 2020 (JP) .............................. JP2020-110254

(51) Int. Cl.
*G02F 1/1362* (2006.01)
*G02F 1/1368* (2006.01)

(52) U.S. Cl.
CPC .... *G02F 1/136209* (2013.01); *G02F 1/13685* (2021.01); *G02F 1/136286* (2013.01); *G02F 2201/40* (2013.01)

(58) Field of Classification Search
CPC ................................................ G02F 1/136286
See application file for complete search history.

(56) References Cited

U.S. PATENT DOCUMENTS

| | | | |
|---|---|---|---|
| 2008/0186423 A1* | 8/2008 | Ishii | G02F 1/136209 349/46 |
| 2018/0173064 A1* | 6/2018 | Ohori | G02F 1/1368 |

FOREIGN PATENT DOCUMENTS

| | | | | |
|---|---|---|---|---|
| JP | 2002090721 | | 3/2002 | |
| JP | 2004158518 | | 6/2004 | |
| JP | 2008191200 | | 8/2008 | |
| JP | WO-2018074060 | * | 8/2017 | ........... G02F 1/1368 |
| JP | 2018101067 | | 6/2018 | |
| JP | 2018146870 | | 9/2018 | |
| WO | 2018074060 | | 4/2018 | |

* cited by examiner

*Primary Examiner* — Sang V Nguyen
(74) *Attorney, Agent, or Firm* — JCIPRNET

(57) ABSTRACT

An electro-optical device includes a scanning line extending along a first direction and having a light shielding property, a transistor having a semiconductor layer extending along the first direction so as to overlap with the scanning line, a contact hole electrically coupled to the scanning line at a side of a channel region of the semiconductor layer, and an opening provided at a side of a first LDD region and a second LDD region of the semiconductor layer.

15 Claims, 29 Drawing Sheets

ELECTRO-OPTICAL DEVICE AND ELECTRONIC DEVICE

The present application is based on and claims priority from JP Application Serial Number 2020-110254, filed on Jun. 26, 2020, the disclosure of which is hereby incorporated by reference herein in its entirety.

BACKGROUND

1. Technical Field

The present disclosure relates to an electro-optical device and an electronic device.

2. Related Art

An active-drive type liquid crystal device that includes a pixel including a switching element has been known as an electro-optical device. Such a liquid crystal device is used, for example, as a light valve of a projector serving as an electronic device.

The liquid crystal device has a problem in that a TFT property changes if strong light coming, for example, from a laser light source of the projector enters a semiconductor layer such as the switching element, in particular, enters an LDD region. For example, JP-A-2008-191200 discloses a technique in which a contact portion for a gate potential is provided adjacently so as to be along the LDD region from a channel region to suppress light entering the LDD region.

However, when the contact portion for a gate potential is used as a light shielding wall, there is a problem in that the TFT property changes if the contact portion is disposed too close to the LDD region, which makes it difficult to achieve a high aperture ratio.

SUMMARY

An electro-optical device includes a scanning line extending along a first direction and having a light shielding property, a transistor having a semiconductor layer extending along the first direction so as to overlap with the scanning line, a first light shielding portion at a side of a channel region of the semiconductor layer, the first light shielding portion being electrically coupled to the scanning line, and a second light shielding portion provided at a side of an LDD region of the semiconductor layer.

An electronic device includes the electro-optical device described above.

DESCRIPTION OF EXEMPLARY EMBODIMENTS

First Embodiment

Figure 1:
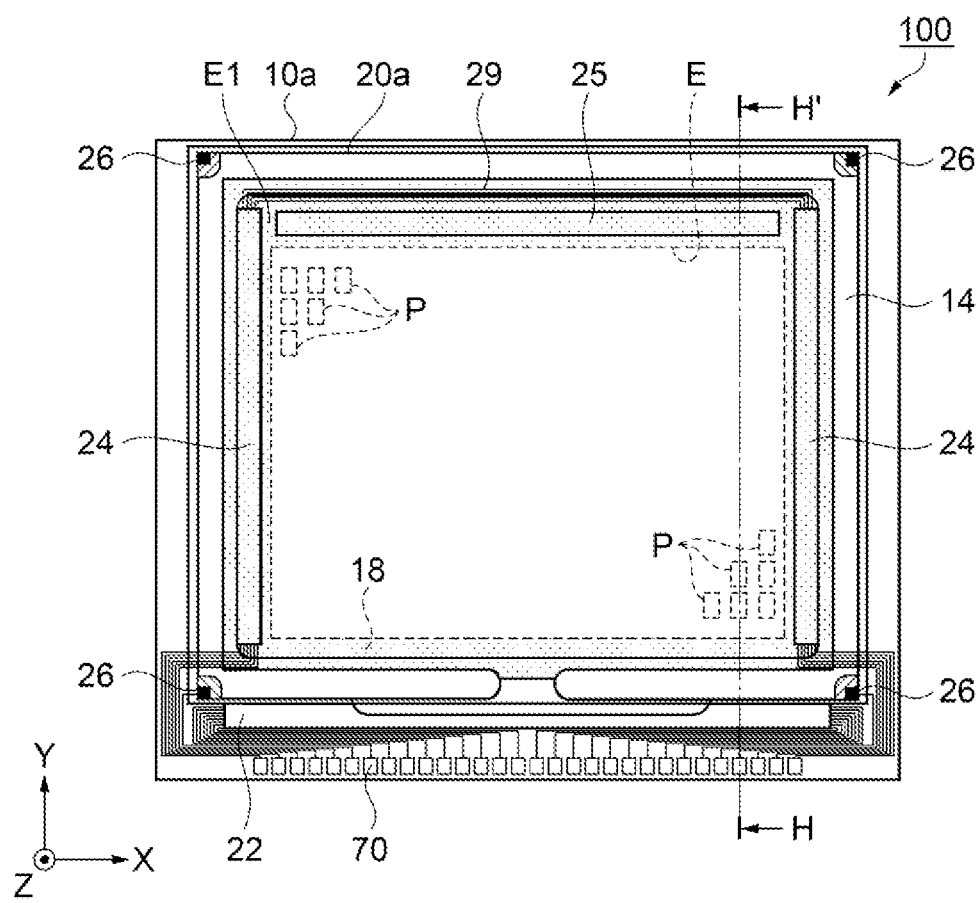
FIG. 1 is a plan view illustrating a configuration of a liquid crystal device according to a first embodiment.
Figure 2:
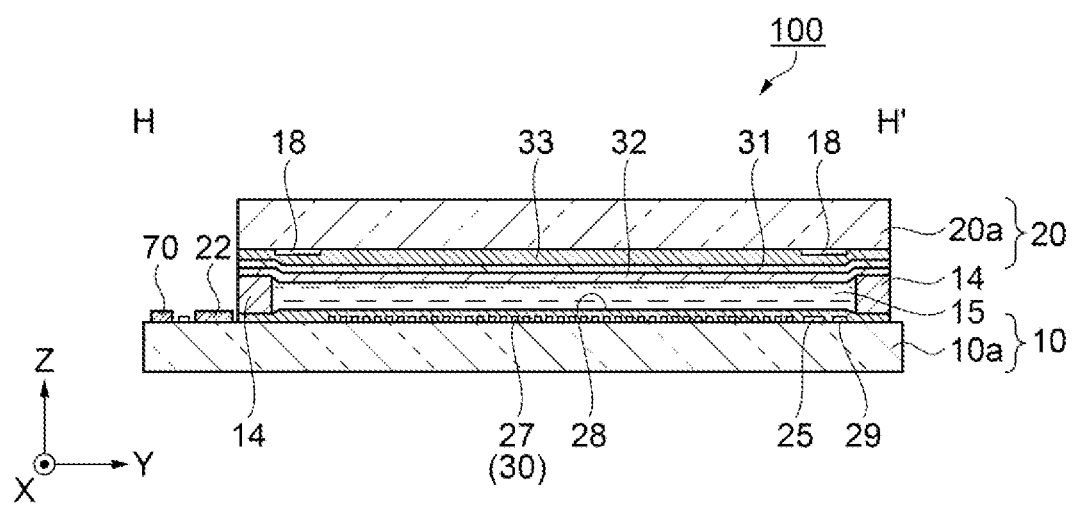
FIG. 2 is a cross-sectional view taken along the H-H' line of the liquid crystal device illustrated in FIG. 1.

As illustrated in FIGS. 1 and 2, a liquid crystal device 100 according to the present embodiment serving as an electro-optical device includes an element substrate 10 and a counter substrate 20, which are disposed so as to be opposed to each other, and also includes a liquid crystal layer 15 interposed between these paired substrates. For example, glass, quartz, or the like is used for a first base member 10a serving as a substrate that forms the element substrate 10 and a second base member 20a that forms the counter substrate 20.

The element substrate 10 is larger than the counter substrate 20. These substrates are joined to each other through a seal material 14 disposed along the outer periphery of the counter substrate 20. A liquid crystal having positive or negative dielectric anisotropy is enclosed in a space between them to form the liquid crystal layer 15.

For example, an adhesive such as thermosetting or ultraviolet curing epoxy resin is used for the seal material 14. For example, a spacer is mixed in the seal material 14 to maintain a constant space between the paired substrates.

A display region E in which a plurality of pixels P that contribute to displaying are arranged is provided on the inner side of the seal material 14. A peripheral area E1 provided with a peripheral circuit or the like that does not contribute to displaying is disposed around the display region E.

A data-line drive circuit 22 is provided between one side of the element substrate 10 and the seal material 14 located along this one side. Furthermore, an inspection circuit 25 is provided between the display region E and the seal material 14 located along another one side opposed to the above-described one side. In addition, a scanning line drive circuit 24 is provided between the display region E and the seal material 14 located along other two sides intersecting the one side at right angles and opposed to each other. A plurality of wiring lines 29 that couple the two scanning line drive circuits 24 are provided between the inspection circuit 25 and the seal material 14 located along the other one side opposed to the one side.

A light shielding film 18 similarly having a frame shape is provided on an inner side of the seal material 14 disposed in a frame manner on the counter substrate 20 side. The light shielding film 18 is made out, for example, of a metal or metallic oxide having a light reflection property. The display region E having a plurality of pixels P is formed on the inner side of the light shielding film 18. For example, tungsten silicide (WSi) can be used for the light shielding film 18.

The wiring lines coupled to the data-line drive circuit 22 and the scanning line drive circuit 24 are coupled to a plurality of external connection terminals 70 arranged along the one side. In the description below, the X direction represents a direction extending along the one side, and the Y direction represents a direction extending along other two sides intersecting the one side at right angles and opposed to each other. In addition, the view from the Z direction is referred to as plan view.

As illustrated in FIG. 2, the surface of the first base member 10a on the liquid crystal layer 15 side includes a pixel electrode 27 having optical transparency and provided for each of the pixels P, a thin film transistor (hereinafter, referred to as a "transistor 30") serving as a switching element, a data line (not illustrated), and a first alignment film 28 that covers these elements.

The pixel electrode 27 is an electrically conductive transparent film, for example, made of indium tin oxide (ITO) or the like. The element substrate 10 according to the present disclosure includes, at least, the pixel electrode 27, the transistor 30, and the first alignment film 28.

The surface of the counter substrate 20 on the liquid crystal layer 15 side includes the light shielding film 18, an insulating layer 33 formed in a form of film so as to cover the light shielding film 18, a common electrode 31 provided so as to cover the insulating layer 33, and a second alignment film 32 that covers the common electrode 31. The counter substrate 20 according to the present disclosure includes, at least, the light shielding film 18, the common electrode 31, and the second alignment film 32.

The light shielding film 18 surrounds the display region E as illustrated in FIG. 1, and is provided at a position that overlaps with the scanning line drive circuit 24 and the inspection circuit 25 in plan view. This makes it possible to block light entering the peripheral circuits including these drive circuits from the counter substrate 20 side, thereby functioning to prevent the peripheral circuits from malfunctioning due to the light. In addition, the light shielding film 18 blocks light so that unnecessary stray light does not enter the display region E, thereby achieving high contrast in display at the display region E.

The insulating layer 33 is made, for example, of an inorganic material such as silicon oxide, and has optical transparency. The insulating layer 33 is provided so as to cover the light shielding film 18. A method of forming such an insulating layer 33 includes a film forming method using a chemical vapor deposition (CVD) method, for example.

The common electrode 31 is an electrically conducting transparent film made, for example, of ITO. In addition, the common electrode 31 covers the insulating layer 33 and is electrically coupled to the wiring line on the element substrate 10 side through an up-down electrically continuous portion 26 provided at each of four corners of the counter substrate 20 as illustrated in FIG. 1.

The first alignment film 28 that covers the pixel electrode 27 and the second alignment film 32 that covers the common electrode 31 are selected on the basis of optical design of the liquid crystal device 100. The first alignment film 28 and the second alignment film 32 include an inorganic alignment film obtained by using a vapor deposition method to form a film of an inorganic material such as silicon oxide (SiOx) and orienting the film substantially vertically with respect to liquid crystal molecules having negative dielectric anisotropy.

For example, such a liquid crystal device 100 has a transmission type, and employs a normally white mode or normally black mode in terms of the optical design. In the normally white mode, the transmittance of a pixel P when no voltage is applied is greater than the transmittance when a voltage is applied. In the normally black mode, the transmittance of a pixel P when no voltage is applied is smaller than the transmittance when a voltage is applied. In use, a polarizing element is disposed at each of the light entrance side and the light exit side so as to correspond to the optical design. Note that it may be possible to apply to a liquid crystal device having a reflective type.

Figure 3:
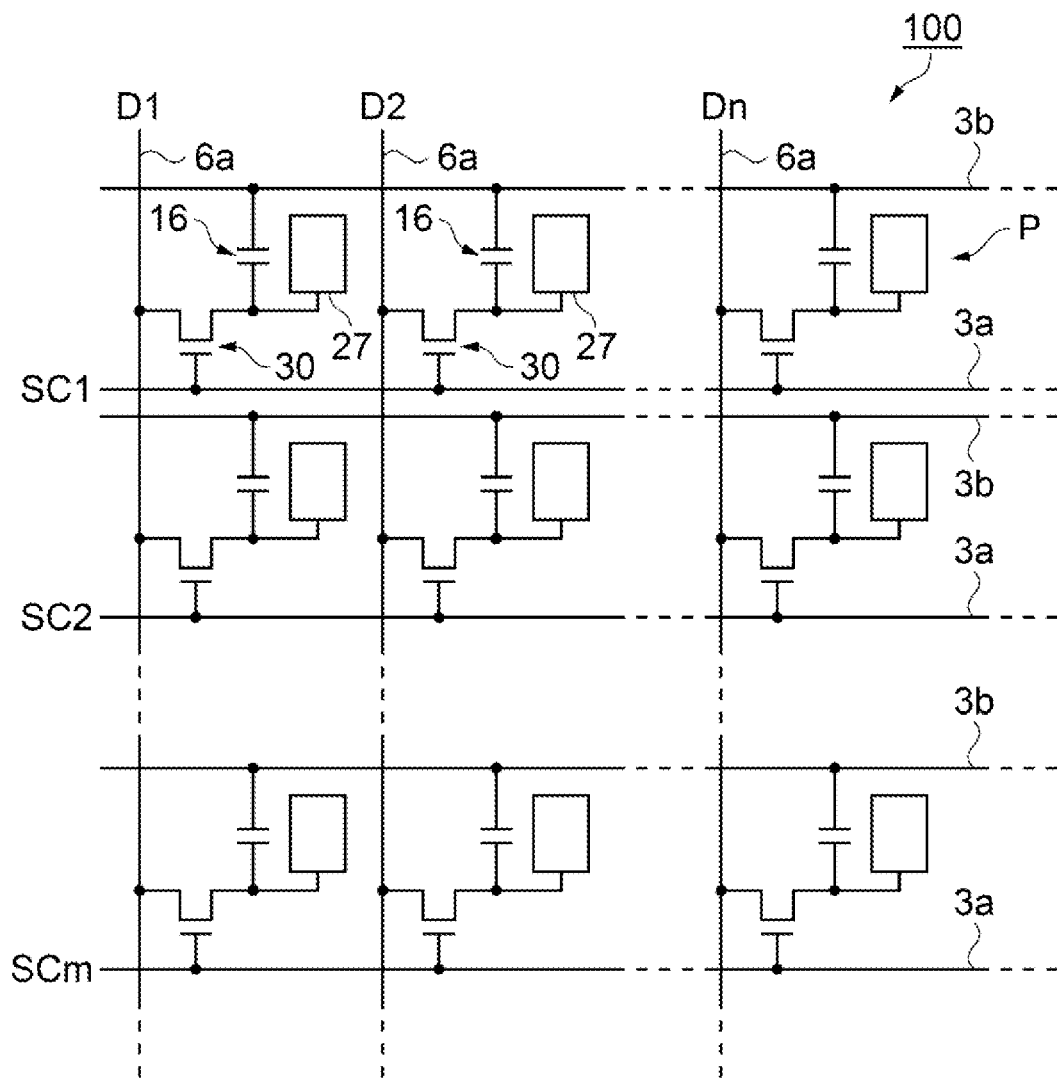
FIG. 3 is an equivalent circuit diagram illustrating an electrical configuration of the liquid crystal device.

As illustrated in FIG. 3, the liquid crystal device 100 includes a plurality of scanning lines 3a and a plurality of data lines 6a, which are insulated from each other at least in the display region E and are perpendicular to each other, and also includes a capacitance line 3b. For example, the X direction is a direction in which the scanning lines 3a extend, and the Y direction is a direction in which the data lines 6a extend. It may also be possible that the capacitance line 3b extends in the X direction or the Y direction.

The scanning line 3a, the data line 6a, the capacitance line 3b, the pixel electrode 27, the transistor 30, and a capacitance element 16 are provided to constitute a pixel circuit of a pixel P. The pixel electrode 27, the transistor 30, and the capacitance element 16 are provided in a region defined by the wiring lines of the scanning line 3a, the data line 6a, and the capacitance line 3b.

The scanning line 3a is electrically coupled to a gate of the transistor 30. The data line 6a is electrically coupled to a source region of the transistor 30. The pixel electrode 27 is electrically coupled to the drain region of the transistor 30.

The data line 6a is coupled to the data-line drive circuit 22 (see FIG. 1) to supply the pixel P with image signals D1, D2, . . . , Dn supplied from the data-line drive circuit 22. The scanning line 3a is coupled to the scanning line drive circuit 24 (see FIG. 1) to supply each of the pixels P with scanning signals SC1, SC2, . . . , SCm supplied from the scanning line drive circuit 24.

The image signals D1 to Dn supplied from the data-line drive circuit 22 to the data line 6a may be supplied in this order in a line sequential manner, or may be supplied on a group-by-group basis, the group being comprised of a plurality of data lines 6a adjacent to each other. The scanning line drive circuit 24 supplies, in a line sequential manner, the scanning line 3a with the scanning signals SC1 to SCm in a form of pulse at predetermined timing.

The liquid crystal device 100 is configured such that, upon input of the scanning signals SC1 to SCm, the transistor 30 serving as a switching element is brought into an ON state only for a certain period, which causes the image signals D1 to Dn supplied from the data line 6a to be written in the pixel electrode 27 at predetermined timing. In addition, the image signals D1 to Dn at a certain level written in the liquid crystal layer 15 through the pixel electrode 27 are retained for a certain period of time between the pixel electrode 27 and the common electrode 31 disposed so as to be opposed to the pixel electrode 27 with the liquid crystal layer 15 being interposed therebetween.

In order to prevent the retained image signals D1 to Dn from leaking, the capacitance element 16 is coupled in parallel with a liquid crystal capacitor formed between the pixel electrode 27 and the common electrode 31. The capacitance element 16 has a dielectric layer serving as a capacitor film provided between two capacitor electrodes.

Figure 4:
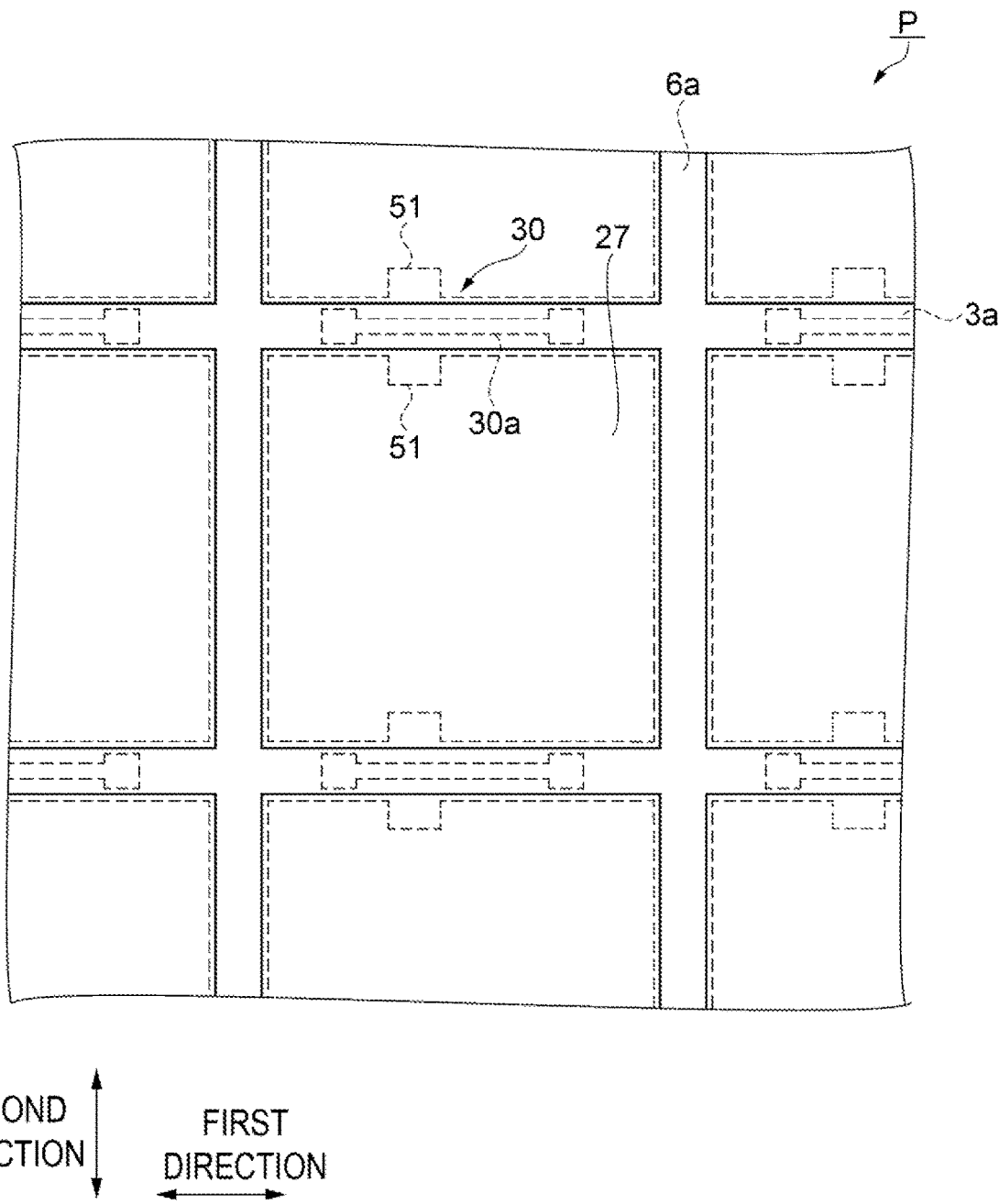
FIG. 4 is a plan view illustrating a configuration of pixels.

As illustrated in FIG. 4, in the pixel P, the data line 6a and the scanning line 3a are disposed between a pixel electrode 27 and a pixel electrode 27 that are adjacent to each other. In this embodiment, for example, the transistor 30 is disposed at a position that overlaps with the scanning line 3a.

Figure 5:
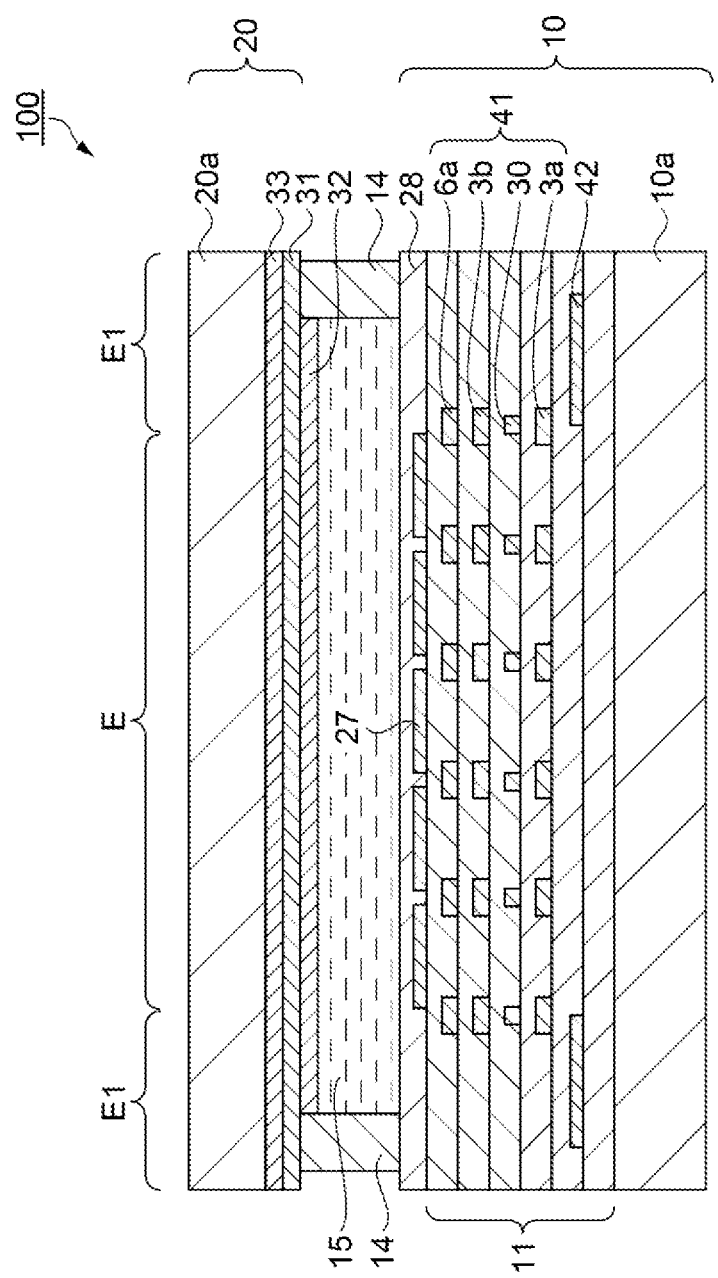
FIG. 5 is a cross-sectional view illustrating a configuration of a pixel.

As illustrated in FIG. 5, the liquid crystal device 100 includes the element substrate 10 and the counter substrate 20 disposed so as to be opposed to the element substrate 10. The first base member 10a that constitutes the element substrate 10 is made, for example, of quartz. The element substrate 10 includes an insulating layer 11, a wiring layer 41, the pixel electrode 27, and the first alignment film 28, which are provided above the first base member 10a.

The insulating layer 11 is made, for example, of silicon oxide, and includes a plurality of insulating layers 11. A light shielding film 42 formed in a rectangular frame shape in plan view is disposed at a portion of the insulating layer 11. The wiring layer 41 includes the scanning line 3a, the transistor 30, the capacitance line 3b, and the data line 6a.

The pixel electrode 27 is disposed above the insulating layer 11. The first alignment film 28 obtained through diagonal vapor deposition of an inorganic material such as silicon oxide is disposed above the pixel electrode 27. The liquid crystal layer 15 in which liquid crystal or the like is enclosed in a space surrounded by the seal material 14 is disposed above the first alignment film 28.

On the other hand, the counter substrate 20 includes a second base member 20a. The second base member 20a is made, for example, of quartz. The counter substrate 20 includes the insulating layer 33, the common electrode 31, and the second alignment film 32, which are provided above the second base member 20a (on the liquid crystal layer 15 side). The common electrode 31 is an electrically conducting transparent film made, for example, of ITO. The second alignment film 32 is formed through diagonal vapor deposition of an inorganic material such as silicon oxide, as with the first alignment film 28. Note that the counter substrate 20 may be provided with a micro lens so as to correspond to the pixel p.

In a state where no electric field is generated between the pixel electrode 27 and the common electrode 31, the liquid crystal layer 15 exhibits a predetermined alignment state with the alignment films 28 and 32. The light L of a projector 1000, which will be described later, enters from the counter substrate 20 side. Next, a configuration of the transistor 30 will be described with reference to FIGS. 6 to 10. Note that it may be possible to employ a configuration in which the light L enters from the element substrate 10 side.

Figure 6:
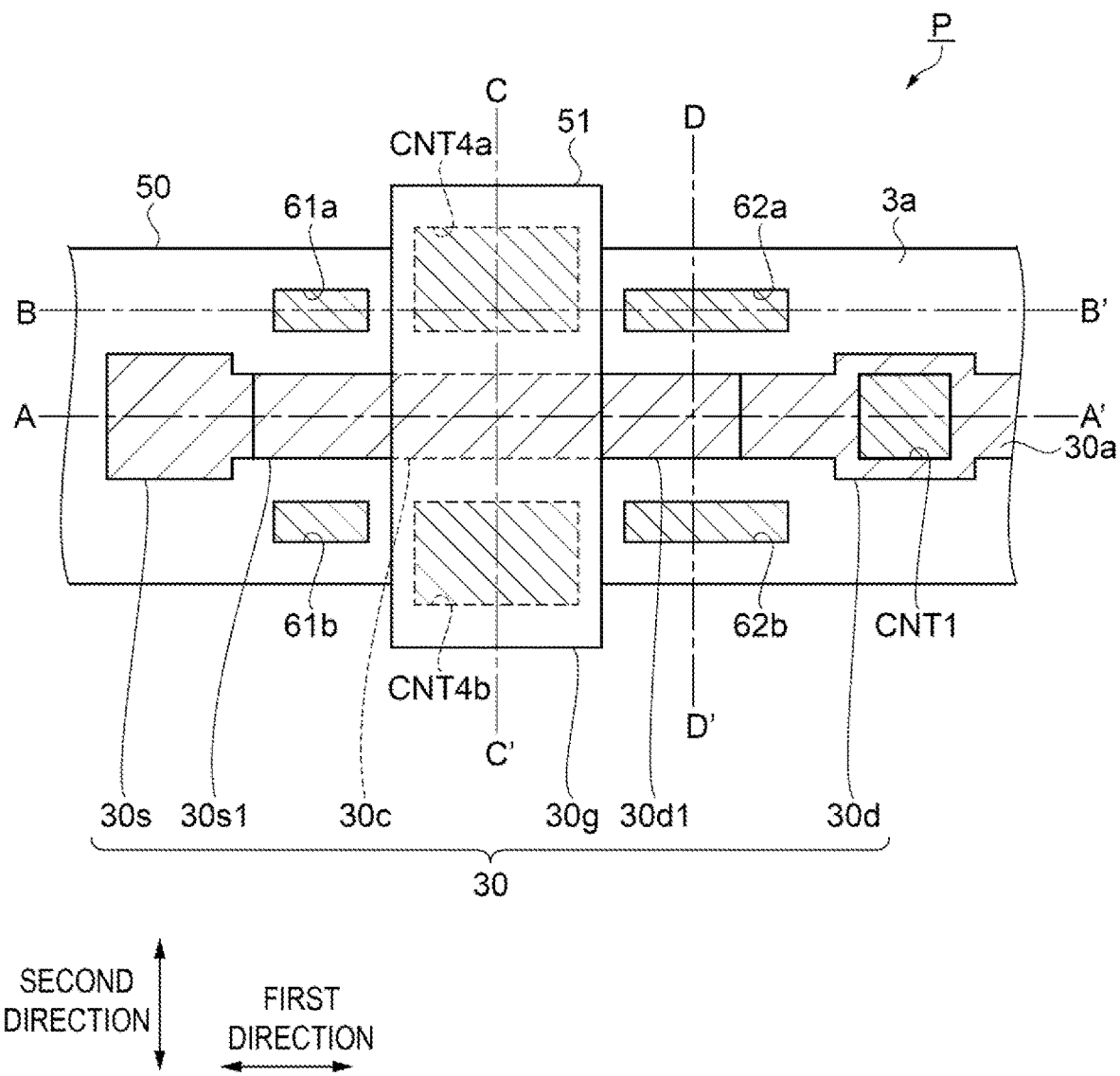
FIG. 6 is a plan view illustrating a configuration of a periphery of a transistor constituting a pixel.
Figure 7:
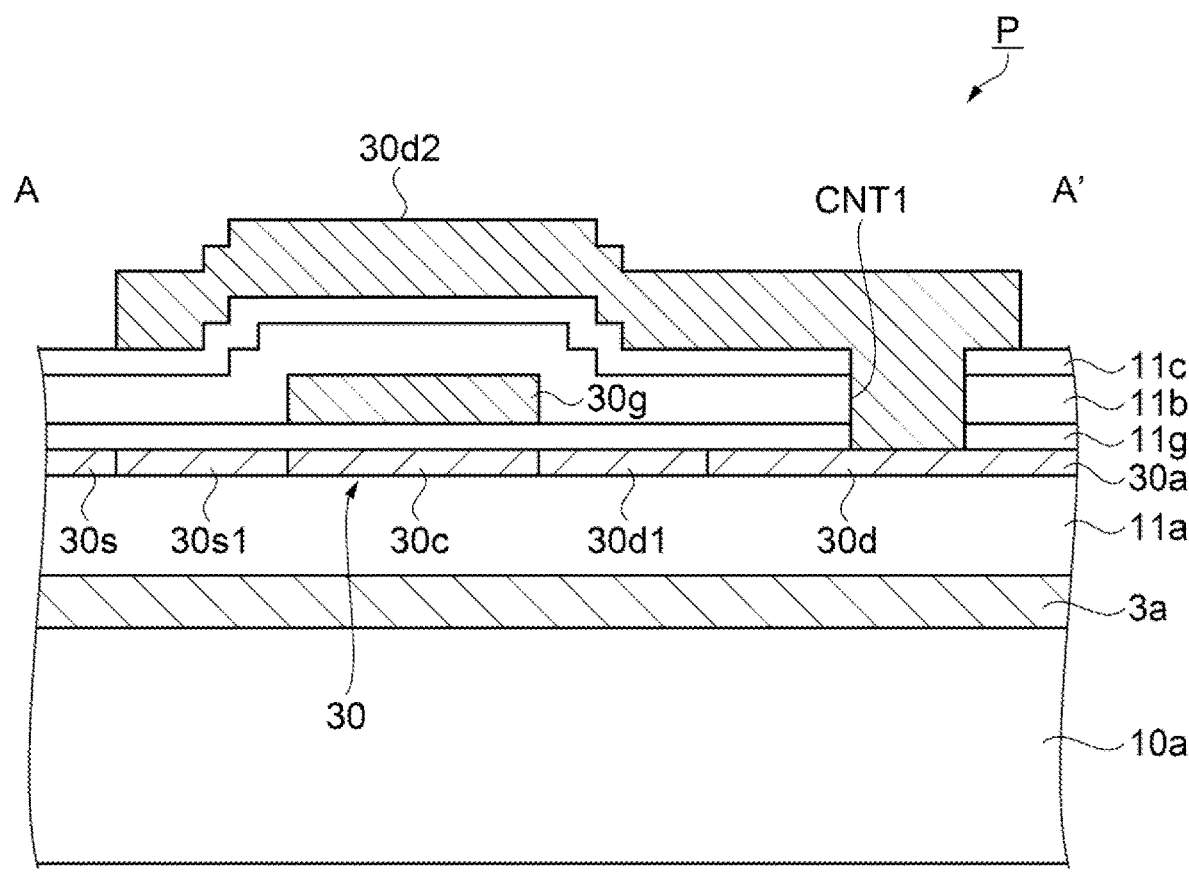
FIG. 7 is a cross-sectional view taken along the A-A' line of the transistor illustrated in FIG. 6.

FIGS. 6 to 10 are diagrams each illustrating a configuration of the transistor 30 and the periphery of the transistor 30. In the pixel P, the scanning line 3a that also functions as a light shielding film made, for example, of tungsten silicide (WSi) is disposed above the first base member 10a, as illustrated in FIGS. 6 and 7. A first insulating layer 11a made, for example, of silicon oxide is disposed above the scanning line 3a. The transistor 30 is formed above the first insulating layer 11a.

The transistor 30 has a lightly doped drain (LDD) structure, and includes a semiconductor layer 30a made, for example, of polysilicon (polycrystalline silicon of high purity), a gate insulation layer 11g formed above the semiconductor layer 30a, and a gate electrode 30g formed above the gate insulation layer 11g and made, for example, of electrically conductive polysilicon, metal silicide, metal, or a metallic compound, or a layer made of these materials.

The semiconductor layer 30a is formed as an n-type transistor 30, for example, by injecting n-type impurity ions such as phosphorus (P) ions. Specifically, the semiconductor layer 30a includes a channel region 30c, a drain region 30d serving as a one-side source drain region, a first LDD region 30d1 disposed between the channel region 30c and the drain region 30d and serving as a one-side LDD region, a source area 30s serving as an other-side source drain region, and a second LDD region 30s1 disposed between the channel region 30c and the source area 30s and serving as an other-side LDD region.

The channel region 30c is doped with p-type impurity ions such as boron (B) ions. The other regions (30s1, 30s, 30d1, 30d) are doped with n-type impurity ions such as phosphorus (P) ions.

A second insulating layer 11b and a third insulating layer 11c each made, for example, of silicon oxide are formed above the gate electrode 30g and the gate insulation layer 11g. A relay wiring line 30d2 serving as a relay layer and made, for example, of aluminum is formed above the third insulating layer 11c serving as an insulating member, the relay wiring line 30d2 being electrically coupled to the drain region 30d through a contact hole CNT1 and functioning as a source drain electrode.

Figure 8:
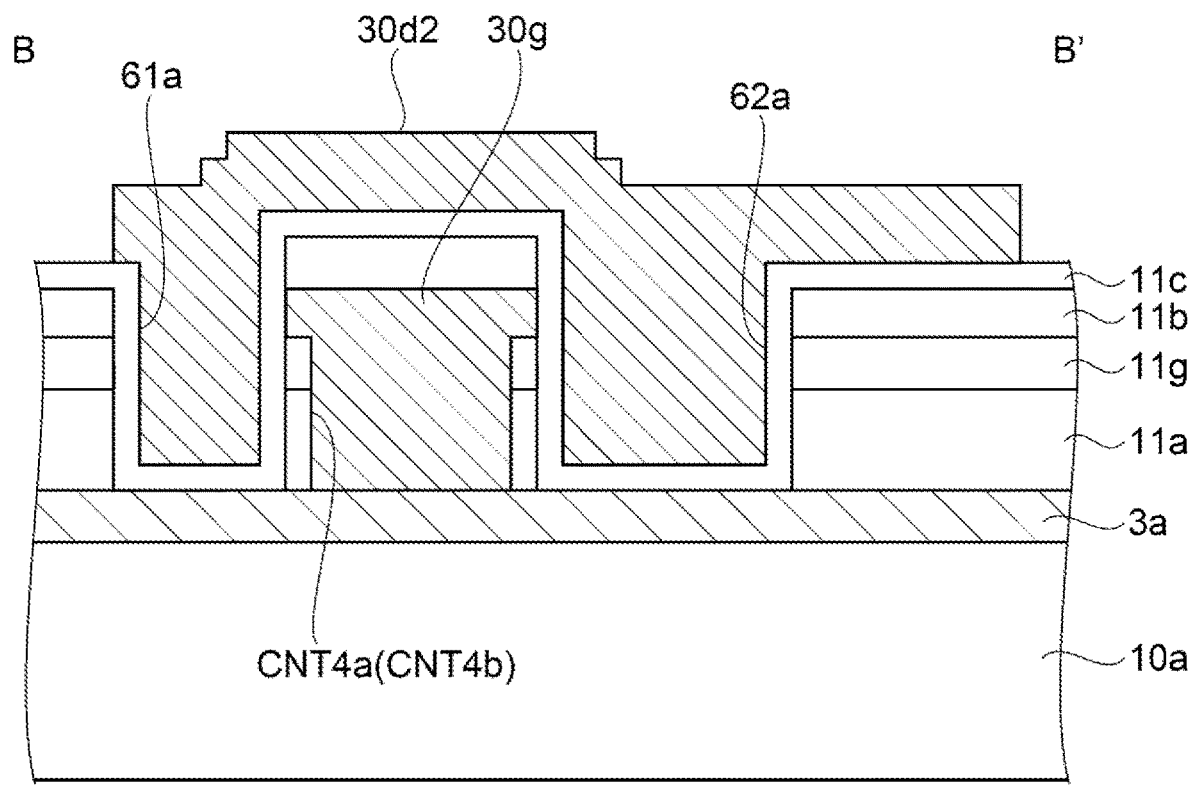
FIG. 8 is a cross-sectional view taken along the B-B' line of the transistor illustrated in FIG. 6.

An opening 61a and an opening 62a are disposed at both side of a contact hole CNT4a interposed therebetween, as illustrated in the cross-sectional view taken along the B-B' line in FIG. 8. In addition, openings 61a and 61b are provided adjacently to the gate electrode 30g, that is, at both sides of the second LDD region 30s1 (see FIG. 6). As illustrated in FIG. 8, the openings 61a and 62a are disposed at positions spaced apart from the gate electrode 30g by a thickness of the third insulating layer 11c.

Note that a portion of the gate electrode 30g, a plug, or other metal materials having a light shielding property is disposed within the contact hole CNT4a, CNT4b, thereby forming a light shielding portion. In addition, a portion of the relay wiring line 30d2 serving as a relay layer, a plug, or other metal materials having a light shielding property is disposed within the opening 61a, 61b, 62a, 62b, thereby forming a light shielding portion.

Figure 9:
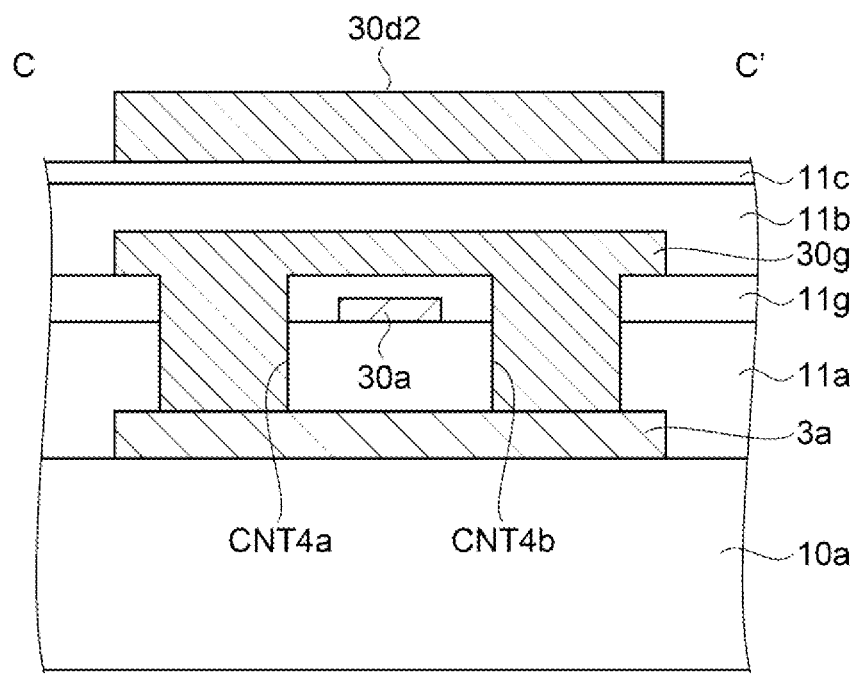
FIG. 9 is a cross-sectional view taken along the C-C' line of the transistor illustrated in FIG. 6.

As illustrated in the cross-sectional view taken along the C-C' line in FIG. 9, the contact holes CNT4a and CNT4b are disposed with the channel region 30c being interposed between them (see FIG. 6). In addition, the contact holes CNT4a and CNT4b are formed so as to extend through the first insulating layer 11a and the gate insulation layer 11g, and are used to electrically couple the gate electrode 30g and the scanning line 3a.

Figure 10:
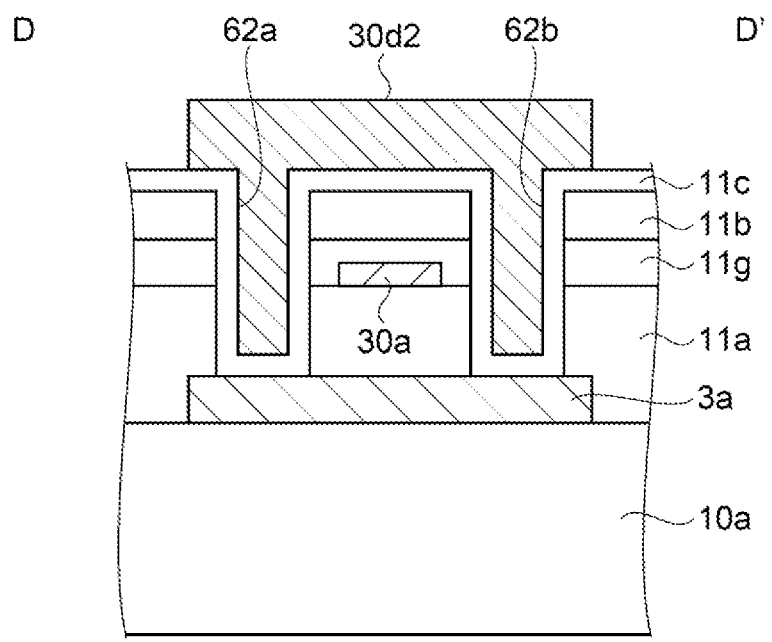
FIG. 10 is a cross-sectional view taken along the D-D' line of the transistor illustrated in FIG. 6.

As illustrated in the cross-sectional view taken along the D-D' line in FIG. 10, the openings 62a and 62b are disposed with the semiconductor layer 30a being interposed between them (see FIG. 6). Note that the third insulating layer 11c allows the insulating property to be secured between the scanning line 3a and the light shielding portion comprised of the portion of the relay wiring line 30d2 or the like within the openings 62a and 62b.

As illustrated in FIG. 6, the space between the opening 61a and the second LDD region 30s1 is equal, for example, to the space between the opening 61b and the second LDD region 30s1. In addition, the space between the opening 61a and the second LDD region 30s1 is equal, for example, to the space between the opening 62a and the first LDD region 30d1. Note that this similarly applies to the position of the opening 62b.

Since the openings 61a, 61b, 62a, 62b that are not electrically coupled to the gate electrode 30g are disposed at the side of the first LDD region 30d1 and the second LDD region 30s1 as described above, it is possible to get the openings 61a and 61b close to the second LDD region 30s1 and also get the openings 62a and 62b close to the first LDD region 30d1 without significantly affecting the property of the transistor 30. This makes it possible to particularly improve the light shielding property of the first LDD region 30d1 and the second LDD region 30s1. In addition, since the openings 61a, 61b, 62a, and 62b can be disposed close to the first LDD region 30d1 and the second LDD region 30s1, it is possible to achieve the high aperture ratio.

Figure 11:
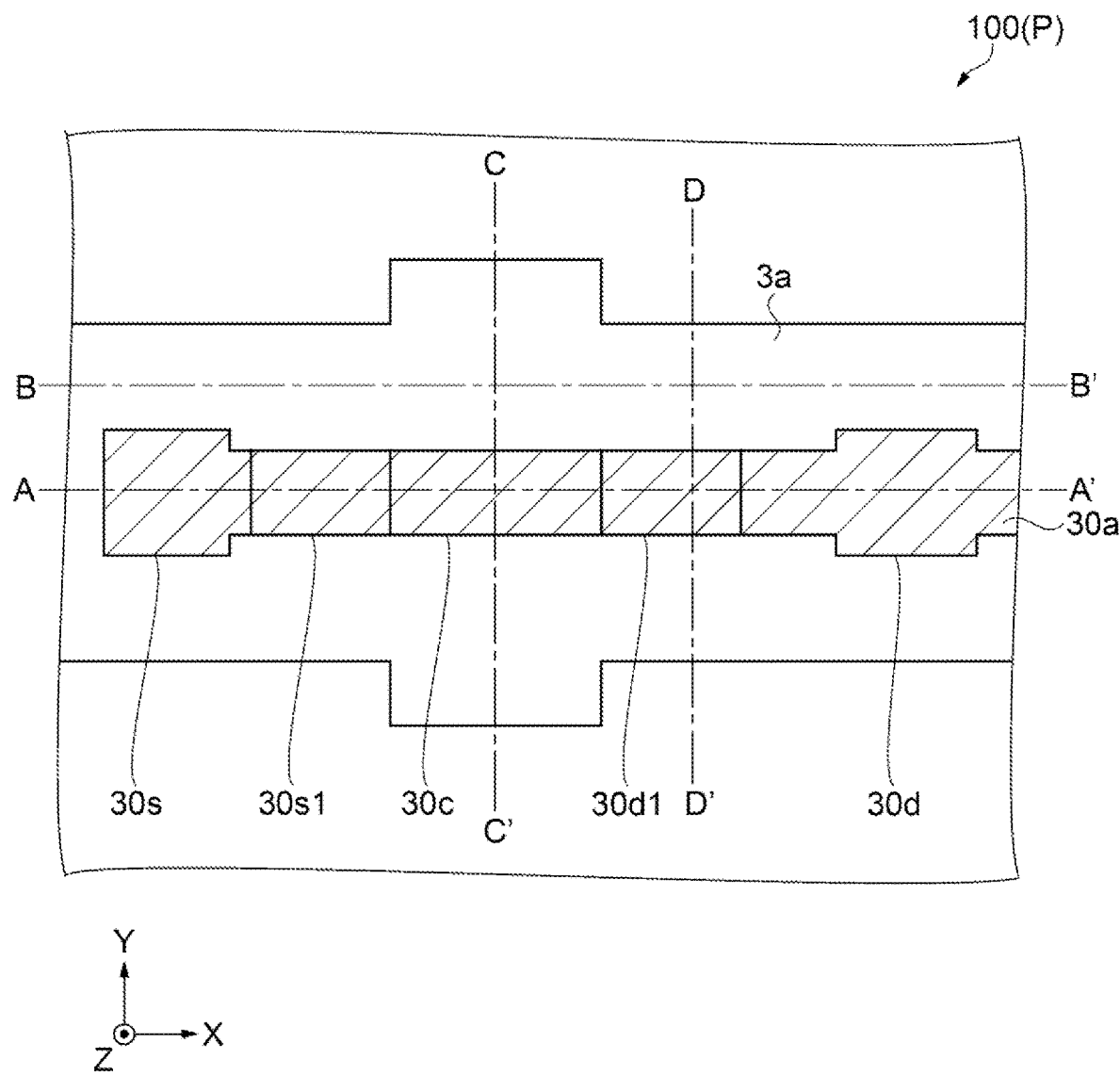
FIG. 11 is a plan view illustrating a portion of a method of manufacturing a transistor constituting a pixel.
Figure 12:
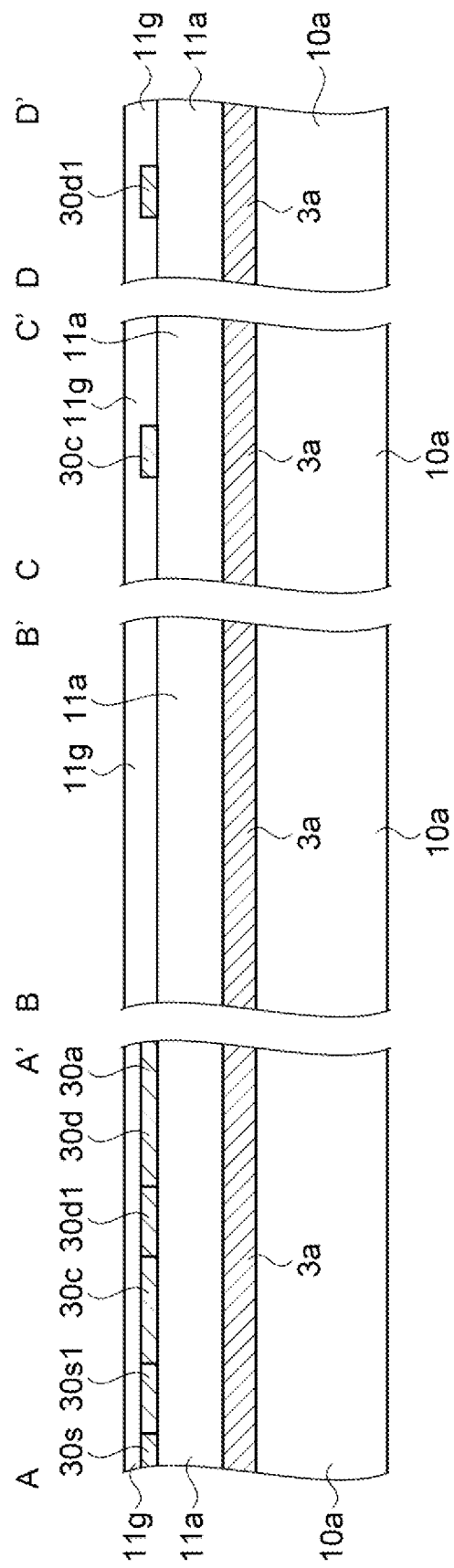
FIG. 12 is a cross-sectional view illustrating a portion of a method of manufacturing a transistor.

Next, the method of manufacturing the liquid crystal device 100, in particular, the peripheral portions including the transistor 30 that constitutes the pixel P will be described with reference to FIGS. 11 to 22. FIG. 11 is a plan view illustrating the configuration of the peripheral portion including the transistor 30 that constitutes the pixel P. FIG. 12 is a cross-sectional view taken along each of the lines in the peripheral portions including the transistor 30 that constitutes the pixel P illustrated in FIG. 11. After this, FIGS. 13 to 22 are plan views and cross-sectional views similar to those described above.

First, the scanning line 3a, the first insulating layer 11a, the semiconductor layer 30a, and the gate insulation layer 11g are formed above the first base member 10a, as illustrated in FIGS. 11 and 12. After this, the channel region 30c, the first LDD region 30d1, the drain region 30d, the second LDD region 30s1, and the source area 30s are formed in the semiconductor layer 30a as described above.

Figure 13:
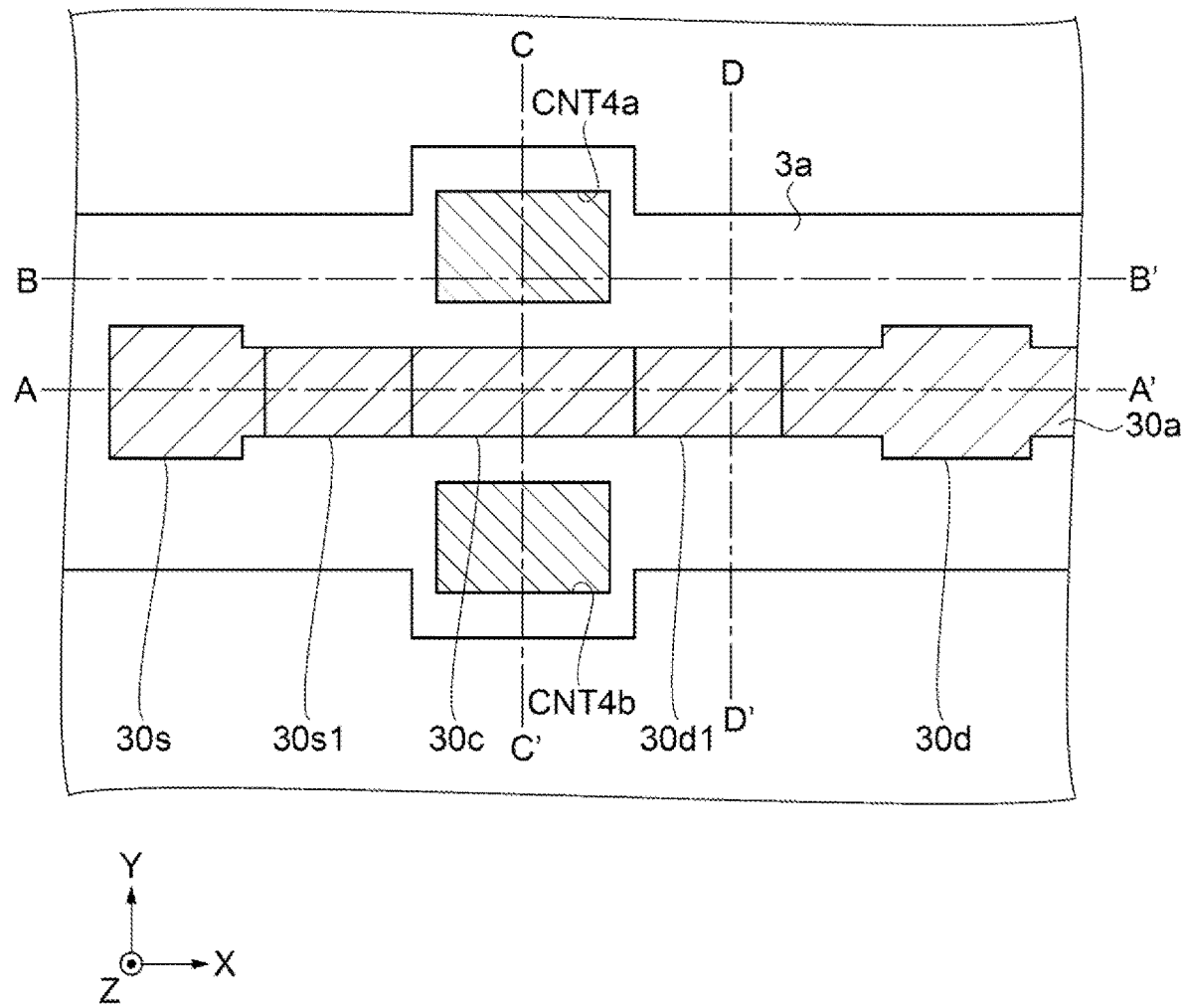
FIG. 13 is a plan view illustrating a portion of a method of manufacturing a transistor.
Figure 14:
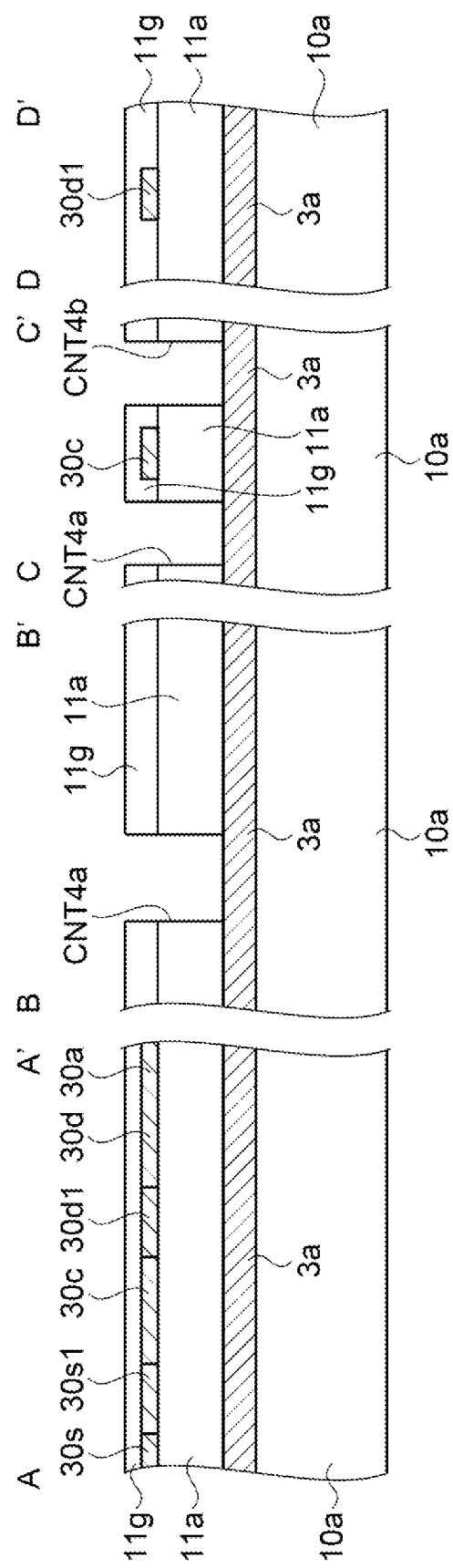
FIG. 14 is a cross-sectional view illustrating a portion of a method of manufacturing a transistor.

Next, the contact holes CNT4a and CNT4b are formed in the gate insulation layer 11g and the first insulating layer 11a, as illustrated in FIGS. 13 and 14. Specifically, the contact holes CNT4a and CNT4b are formed so that the channel region 30c of the semiconductor layer 30a is interposed between them, as illustrated in FIG. 13. Note that portions of the gate insulation layer 11g and the first insulating layer 11a are still left between the semiconductor layer 30a and each of the contact holes CNT4a and CNT4b (see FIG. 13).

Figure 15:
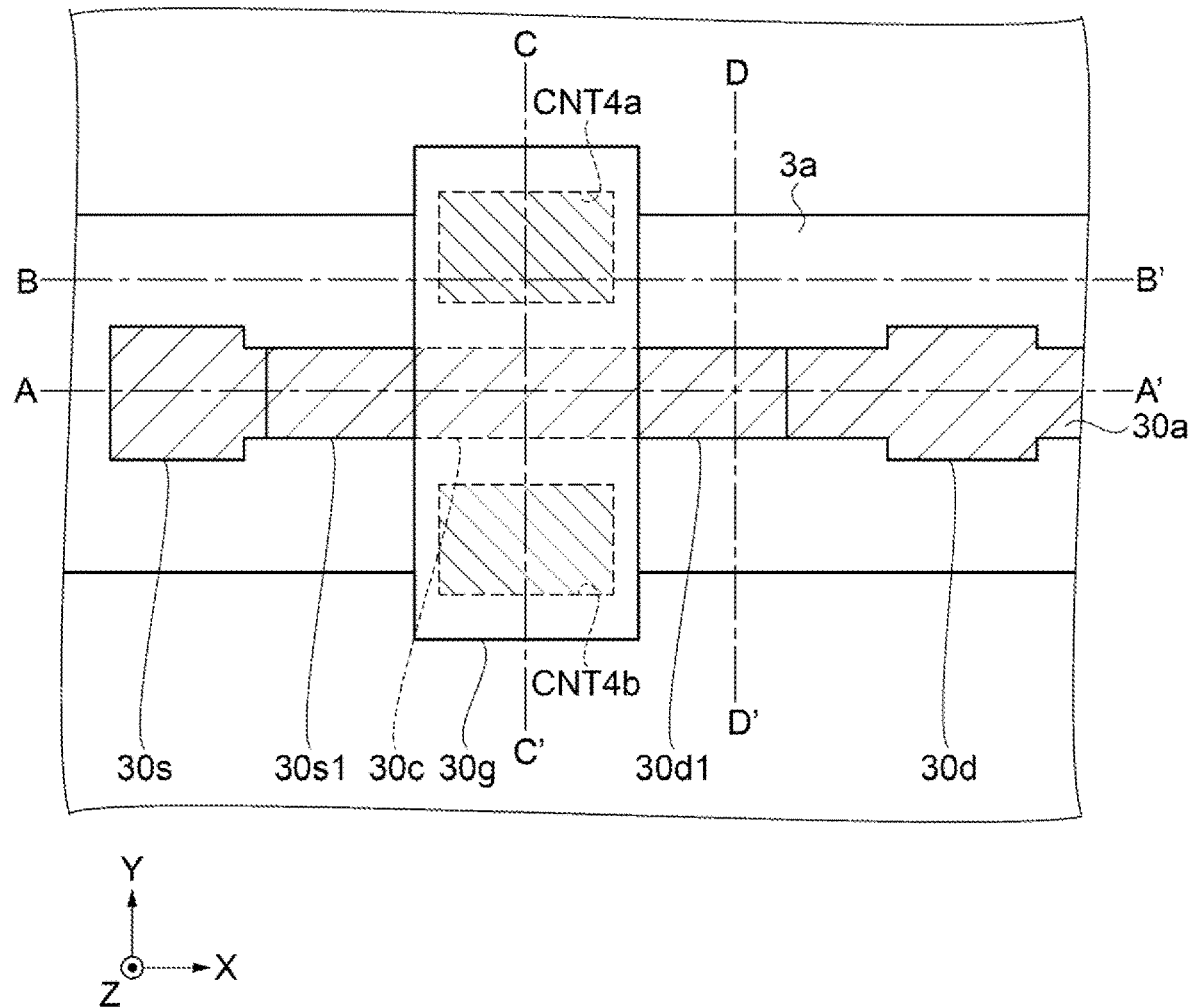
FIG. 15 is a plan view illustrating a portion of a method of manufacturing a transistor.
Figure 16:
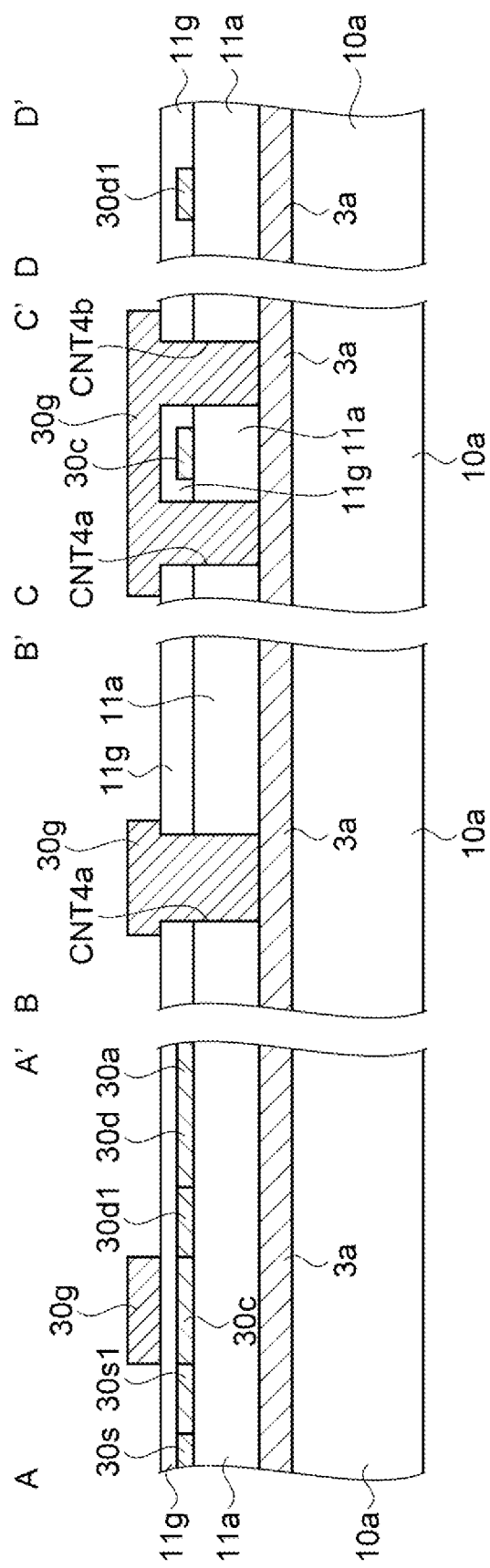
FIG. 16 is a cross-sectional view illustrating a portion of a method of manufacturing a transistor.

Next, the gate electrode 30g and the contact holes CNT4a and CNT4b are completed as illustrated in FIGS. 15 and 16. Specifically, for example, films of electrically conductive polysilicon, metal silicide, metal, or a metallic compound, or a layer made of these materials are formed in the openings of the contact holes CNT4a and CNT4b and above the gate insulation layer 11g. After this, patterning is performed to form the gate electrode 30g and the contact holes CNT4a and CNT4b.

Figure 17:
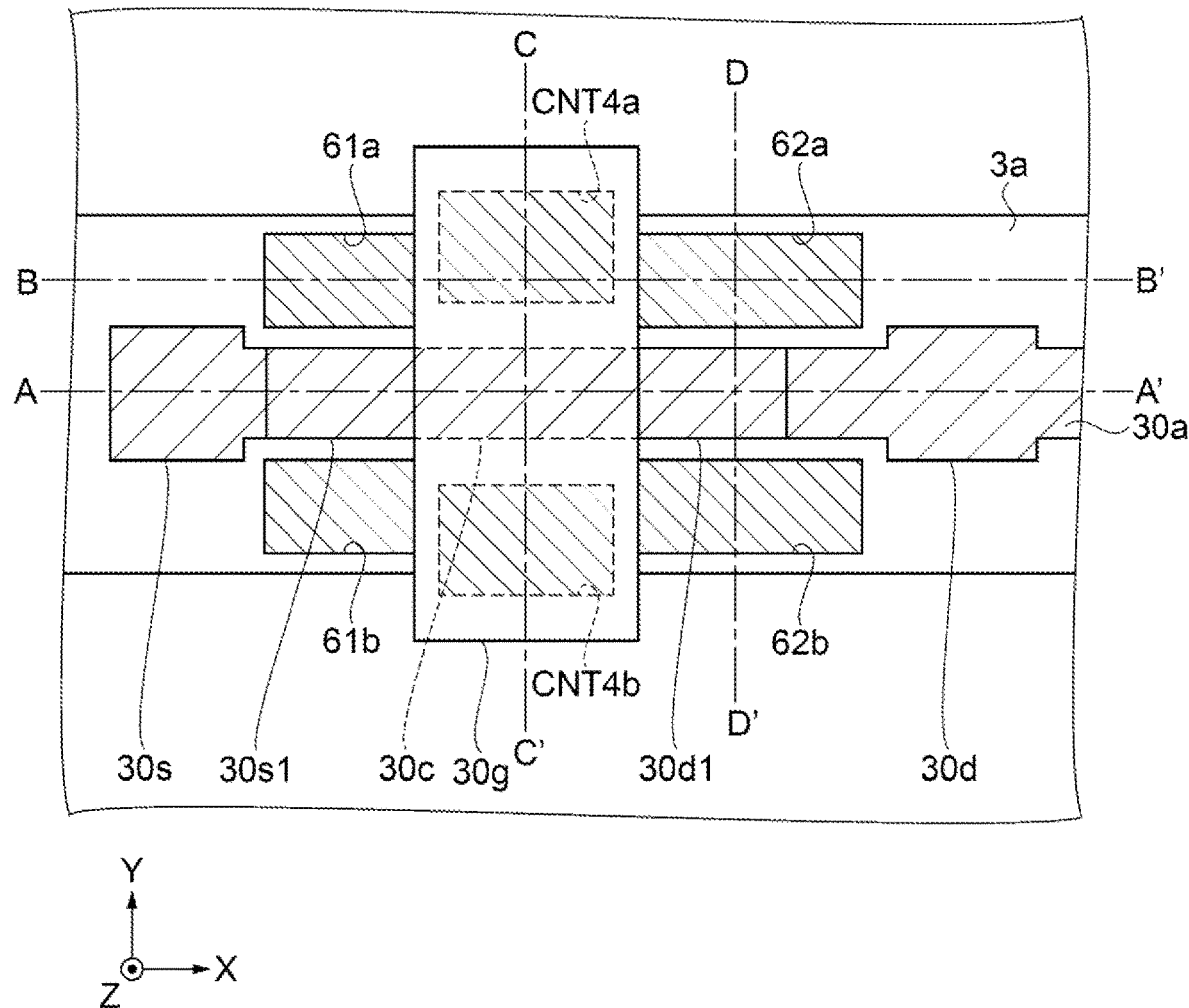
FIG. 17 is a plan view illustrating a portion of a method of manufacturing a transistor.
Figure 18:
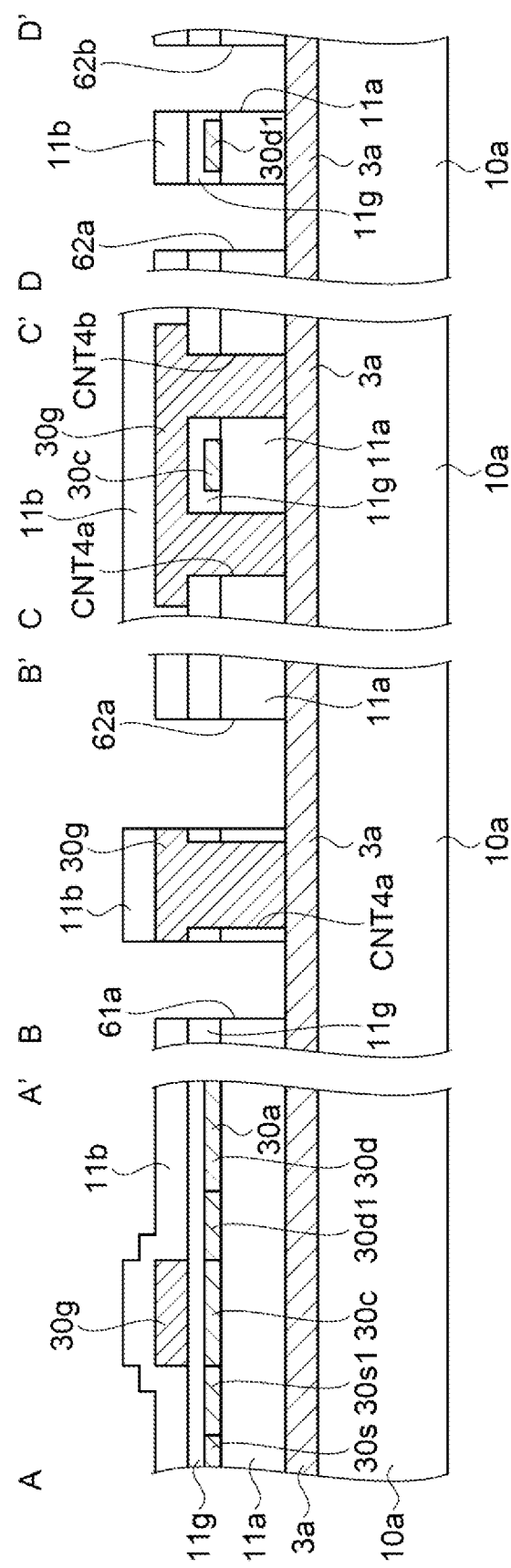
FIG. 18 is a cross-sectional view illustrating a portion of a method of manufacturing a transistor.

Next, after the second insulating layer 11b is formed, the openings 61a, 61b, 62a, and 62b are formed in the second insulating layer 11b, the gate insulation layer 11g, and the first insulating layer 11a, as illustrated in FIGS. 17 and 18. Specifically, the openings 61a, 61b, 62a, and 62b are formed so that the first LDD region 30d1 and the second LDD region 30s1 of the semiconductor layer 30a are interposed between them, as illustrated in FIG. 17. Note that portions of the second insulating layer 11b, the gate insulation layer 11g, and the first insulating layer 11a are still left between the semiconductor layer 30a and each of the openings 61a, 61b, 62a, and 62b (see FIG. 17).

Figure 19:
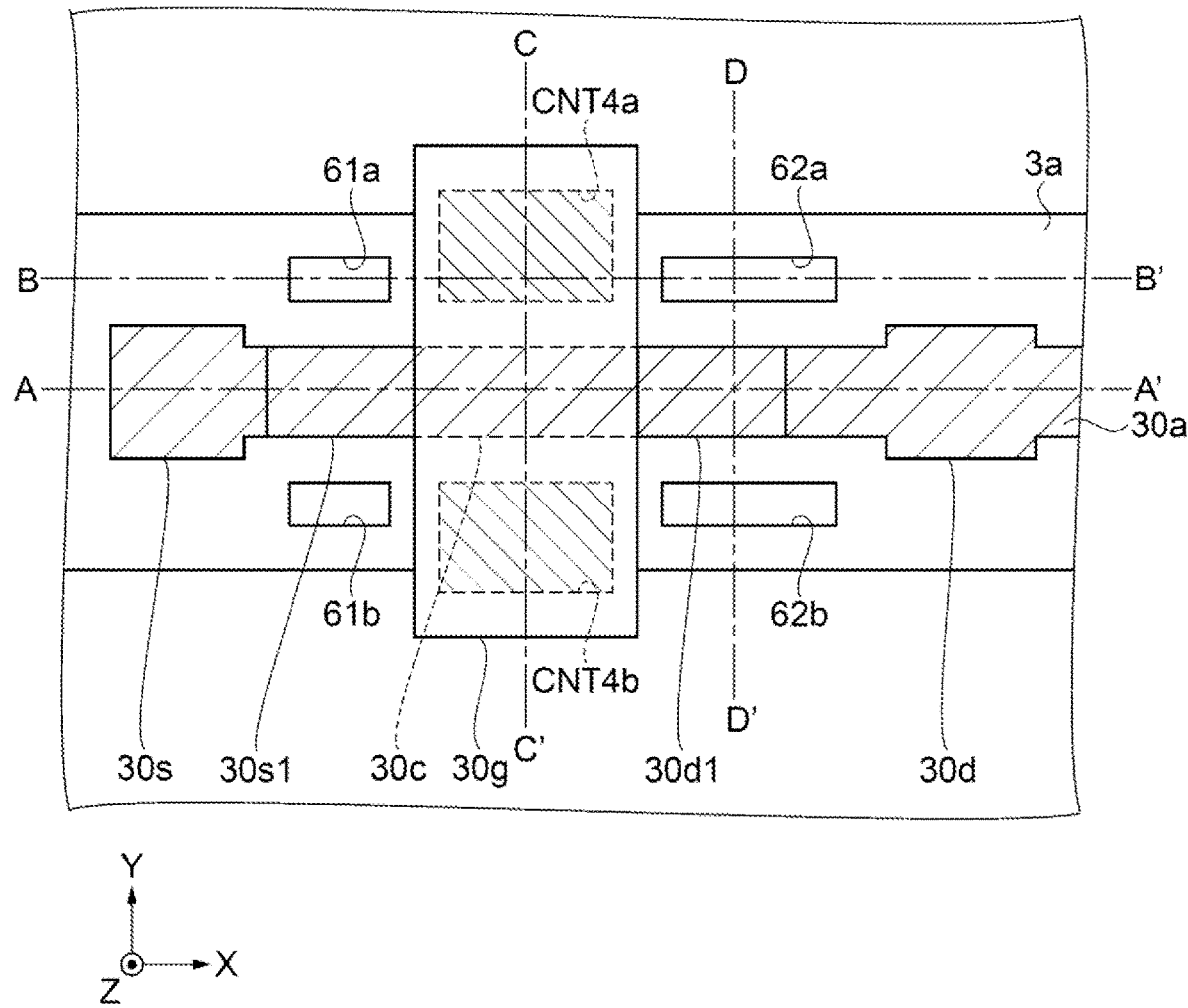
FIG. 19 is a plan view illustrating a portion of a method of manufacturing a transistor.
Figure 20:
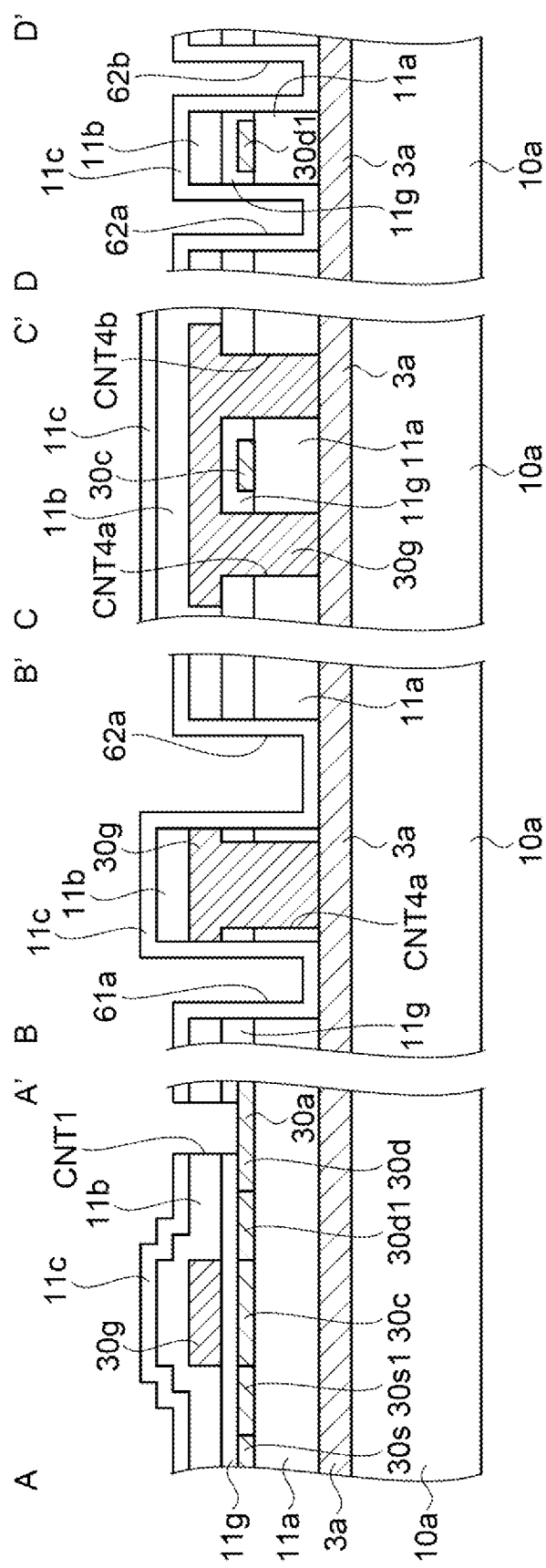
FIG. 20 is a cross-sectional view illustrating a portion of a method of manufacturing a transistor.

Next, as illustrated in FIGS. 19 and 20, the third insulating layer 11c is formed above the exposing surfaces of the openings 61a, 61b, 62a, and 62b and the second insulating layer 11b, and the contact hole CNT1 is formed.

Figure 21:
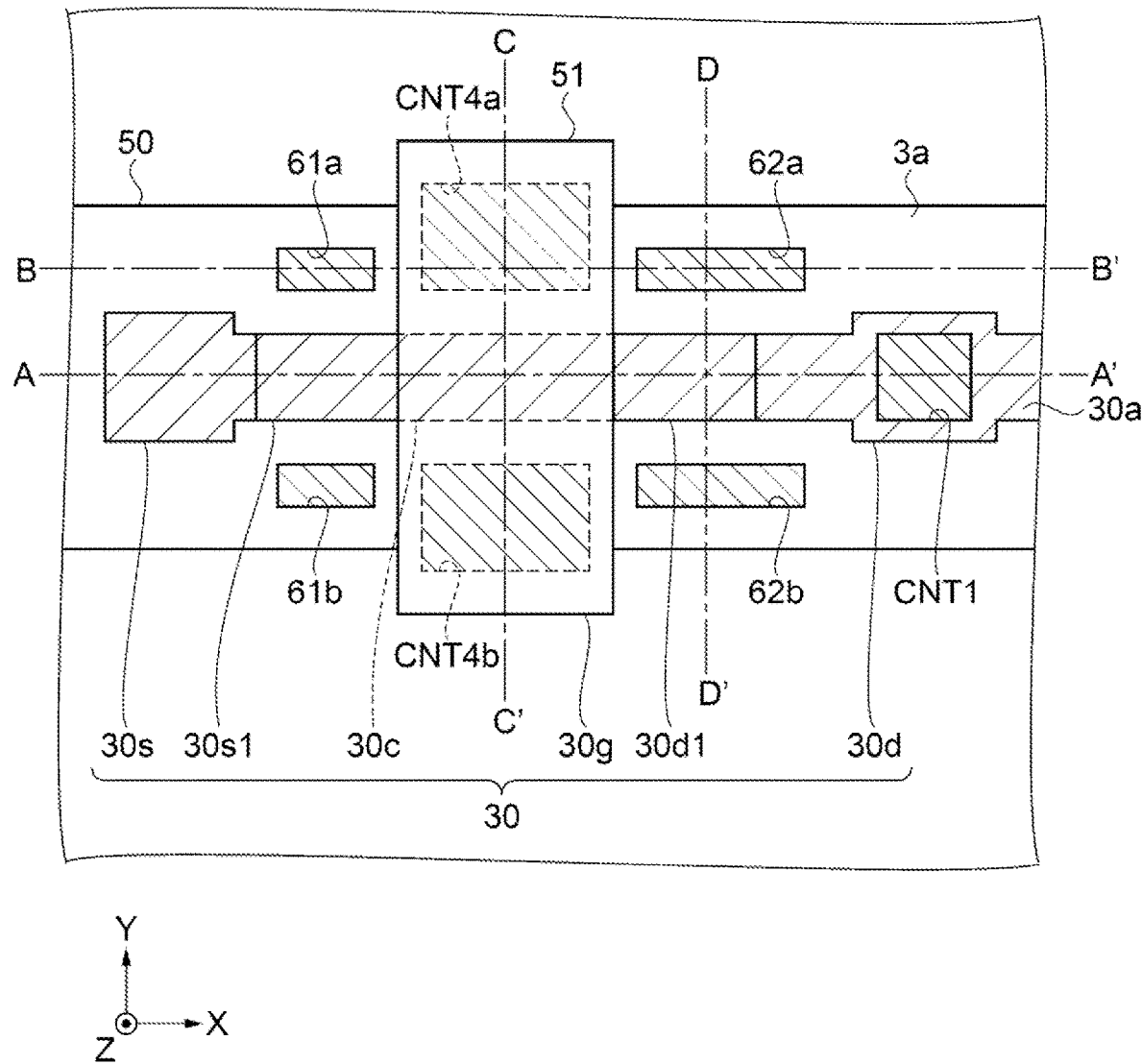
FIG. 21 is a plan view illustrating a portion of a method of manufacturing a transistor.
Figure 22:
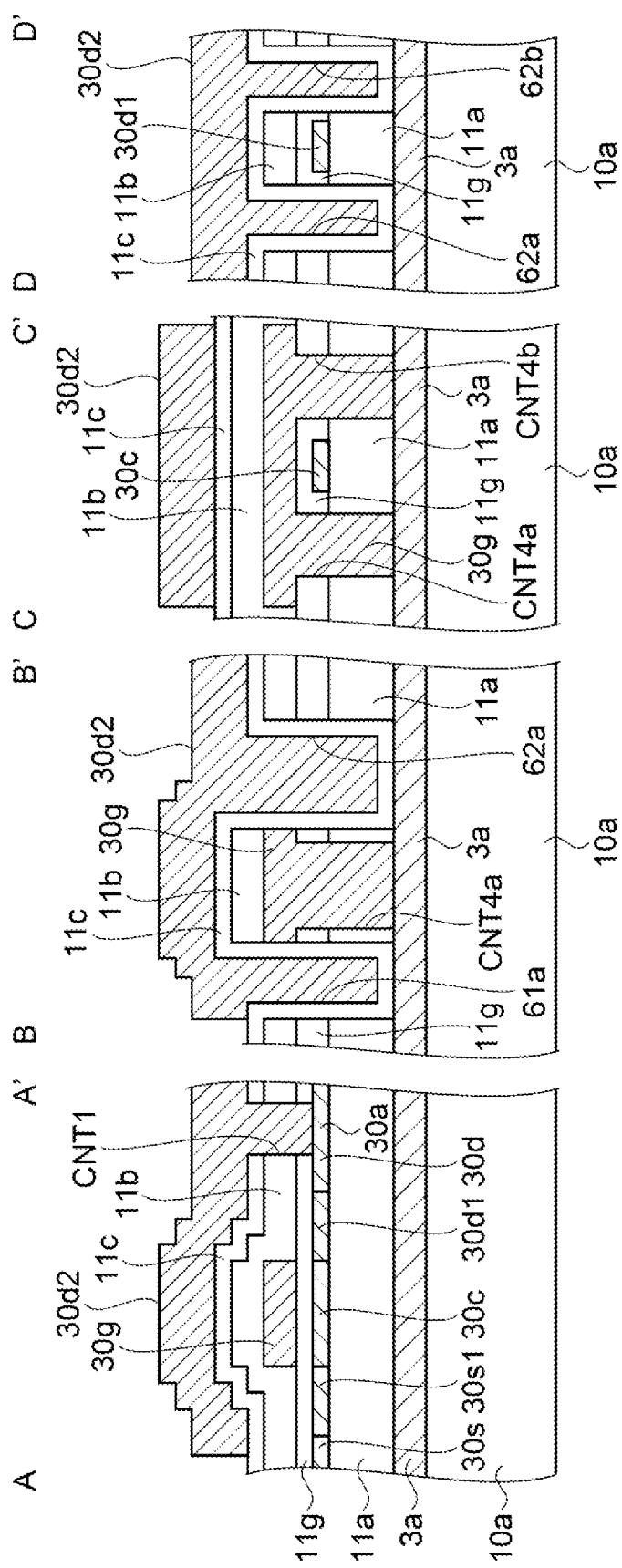
FIG. 22 is a cross-sectional view illustrating a portion of a method of manufacturing a transistor.

Next, as illustrated in FIGS. 21 and 22, for example, a film of aluminum is formed in the openings 61a, 61b, 62a, and 62b and above the third insulating layer 11c. Then, patterning is performed to complete the relay wiring line 30d2 and the openings 61a, 61b, 62a, and 62b.

The relay wiring line 30d2 is electrically coupled to the drain region 30d, and also is electrically coupled to the pixel electrode 27 disposed at the upper layer.

Forming in this manner allows the openings 61a, 61b, 62a, and 62b to be disposed at positions spaced apart from the gate electrode 30g by the film thickness of the third insulating layer 11c. This makes it possible to improve the light shielding property of the first LDD region 30d1 and the second LDD region 30s1. Furthermore, the openings 61a, 61b, 62a, and 62b, which are not electrically coupled to the gate electrode 30g, are disposed at sides of the first LDD region 30d1 and the second LDD region 30s1. This avoids a significant influence on the property of the transistor 30.

Figure 23:
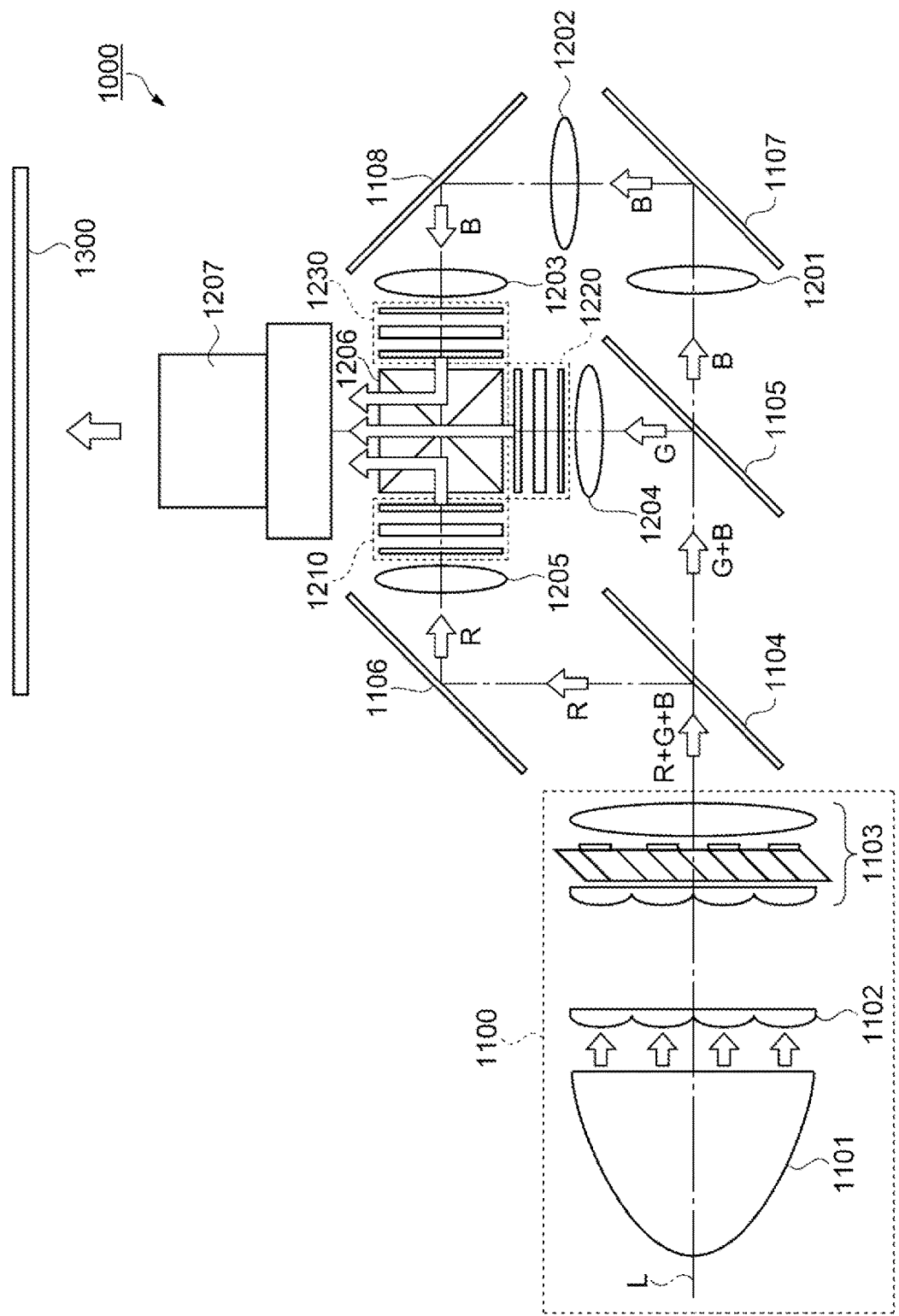
FIG. 23 is a schematic diagram illustrating a configuration of a projector serving as an electronic device.

As illustrated in FIG. 23, a projector 1000 according to this embodiment includes: a polarized-light illumination device 1100 disposed along a system optical axis L; two dichroic mirrors 1104 and 1105 each serving as a light separating element; three reflection mirrors 1106, 1107, and 1108; five relay lenses 1201, 1202, 1203, 1204, and 1205; transmission-type liquid crystal light valves 1210, 1220, and 1230 serving as three light modulators; a cross dichroic prism 1206 serving as a light combining element; and a projection lens 1207.

The polarized-light illumination device 1100 generally includes a lamp unit 1101 serving as a white light source such as an extra-high pressure mercury lamp or a halogen lamp, an integrator lens 1102, and a polarization conversion element 1103.

The dichroic mirror 1104 reflects the red light (R) of a polarized light beam outputted from the polarized-light illumination device 1100 and allows the green light (G) and the blue light (B) to pass through. The other dichroic mirror 1105 reflects the green light (G) transmitted by the dichroic mirror 1104 and allows the blue light (B) to pass through.

The red light (R) reflected by the dichroic mirror 1104 is reflected by the reflection mirror 1106 and then, enters the liquid crystal light valve 1210 through the relay lens 1205. The green light (G) reflected by the dichroic mirror 1105 enters the liquid crystal light valve 1220 through the relay lens 1204. The blue light (B) that has passed through the dichroic mirror 1105 passes through a light guide system including the three relay lenses 1201, 1202, and 1203 and the two reflection mirrors 1107 and 1108, and enters the liquid crystal light valve 1230.

The liquid crystal light valves 1210, 1220, and 1230 are each disposed so as to be opposed to an incident surface of each type of color light of the cross dichroic prism 1206. The color light that enters the liquid crystal light valves 1210, 1220, and 1230 is modulated on the basis of video information (video signal) and is outputted toward the cross dichroic prism 1206.

This prism includes four rectangular prisms bonded together. On the inner surfaces of the prisms, a dielectric multilayer film configured to reflect the red light and a dielectric multilayer film configured to reflect the blue light are formed in a cross shape. These dielectric multilayer films combine the three types of color light to combine lights representing color images. The combined light is projected onto the screen 1300 through the projection lens 1207 serving as a projection optical system, and the image is enlarged and is displayed.

The liquid crystal light valve 1210 is an element to which the liquid crystal device 100 described above is applied. Note that it is also possible to apply liquid crystal light valve 1210 to a liquid crystal device 200 that will be described later. The liquid crystal device 100 is disposed at a space between a pair of polarizing elements disposed in a crossed-Nicols state at the entrance side and the exit side of color light. This similarly applies to other liquid crystal light valves 1220 and 1230.

Note that, in addition to the projector 1000, the electronic device on which the liquid crystal device 100 is mounted includes a head-up display (HUD), a head-mounted display (HMD), a smartphone, an electrical view finder (EVF), a mobile mini-projector, an electronic book, a mobile phone, a mobile computer, a digital camera, a digital video camera, a display, a vehicle mounted unit, an audio unit, an exposing unit, and an illumination device. The liquid crystal device 100 can be used in various types of electronic devices.

As described above, the liquid crystal device 100 according to this embodiment includes: the scanning line 3a extending along the first direction and having a light shielding property: the transistor 30 having the semiconductor layer 30a extending along the first direction so as to overlap with the scanning line 3a; the contact hole CNT4a, CNT4b electrically coupled to the scanning line 3a at a side of a channel region 30c of the semiconductor layer 30a, and the opening 61a, 61b, 62a, 62b provided at a side of the first LDD region 30d1 and the second LDD region 30s1 of the semiconductor layer 30a.

With this configuration, the openings 61a, 61b, 62a, 62b that are not electrically coupled to the gate electrode 30g are disposed at the side of the first LDD region 30d1 and the second LDD region 30s1. This makes it possible to get the openings 61a, 61b, 62a, 62b close to the first LDD region 30d1 and the second LDD region 30s1 without significantly affecting the property of the transistor 30. This makes it possible to particularly improve the light shielding property of the first LDD region 30d1 and the second LDD region 30s1. In addition, since the openings 61a, 61b, 62a, and 62b can be disposed close to the first LDD region 30d1 and the second LDD region 30s1, it is possible to achieve the high aperture ratio.

Furthermore, the contact holes CNT4a and CNT4b extend in the first direction along the channel region 30c, and the openings 61a, 61b, 62a, and 62b each extend in the first direction along the first LDD region 30d1 and the second LDD region 30s1.

With this configuration, the contact holes CNT4a and CNT4b extend along the channel region 30c, and the openings 61a, 61b, 62a, and 62b each extend along the first LDD region 30d1 and the second LDD region 30s1. This makes it possible to shield each of the regions as a whole from light. Thus, it is possible to improve the light shielding property of each of the regions.

Furthermore, the space between the opening 61a, 61b and the second LDD region 30s1 is equal to the space between the opening 62a, 62b and the first LDD region 30d1.

With this configuration, it is possible to improve the light shielding property while suppressing the influence of light on the first LDD region 30d1 and the second LDD region 30s1.

With this configuration, it is possible to shield the first LDD region 30d1 and the second LDD region 30s1 from light without additional electrodes for potential or wiring lines being disposed.

In addition, the first insulating layer 11a disposed between the scanning line 3a and the transistor 30 and the second insulating layer 11b (including the gate insulation layer 11g) that covers the transistor 30 are provided, and the openings 61a, 61b, 62a, and 62b are provided within the openings that extend through the first insulating layer 11a and the second insulating layer 11b.

With this configuration, the openings 61a, 61b, 62a, and 62b are provided within the openings that each extend from the first insulating layer 11a to the second insulating layer 11b. Thus, a portion from the upper portion over the lower portion of the transistor 30 can be shield from light. This make it possible to particularly improve the light shielding property of the first LDD region 30d1 and the second LDD region 30s1.

In addition, there are provided the pixel electrode 27, and the relay wiring line 30d2 that electrically couples the pixel electrode 27 and the openings 61a, 61b, 62a, and 62b. The scanning line 3a and the relay wiring line 30d2 each include a main body portion 50 extending in the first direction and a protrusion 51 that protrudes in a second direction intersecting the first direction so as to overlap with the contact hole CNT4a and CNT4b. The openings 61a, 61b, 62a, and 62b are disposed within the openings provided at both side of the protrusion 51.

With this configuration, the scanning line 3a and the relay wiring line 30d2 include the main body portion 50 and the protrusion 51. This makes it possible to effectively utilize the light shielding region. Thus, it is possible to achieve the high aperture ratio.

Furthermore, within the openings, the third insulating layer 11c serving as an insulating member is provided between the scanning line 3a and each of the openings 61a, 61b, 62a, and 62b.

With this configuration, the third insulating layer 11c is provided within the opening. This makes it possible to secure the insulating property between the scanning line 3a and the light shielding portion comprised of a portion of the relay wiring line 30d2 or the like within each of the openings 61a, 61b, 62a, and 62b, and also possible to shield, from light, a portion from the upper portion over the lower portion of the transistor 30. Thus, it is possible to particularly improve the light shielding property of the first LDD region 30d1 and the second LDD region 30s1.

Furthermore, with the liquid crystal device 100 described above being provided, it is possible to provide the projector 1000 that makes it possible to improve the display quality.

Second Embodiment

Figure 24:
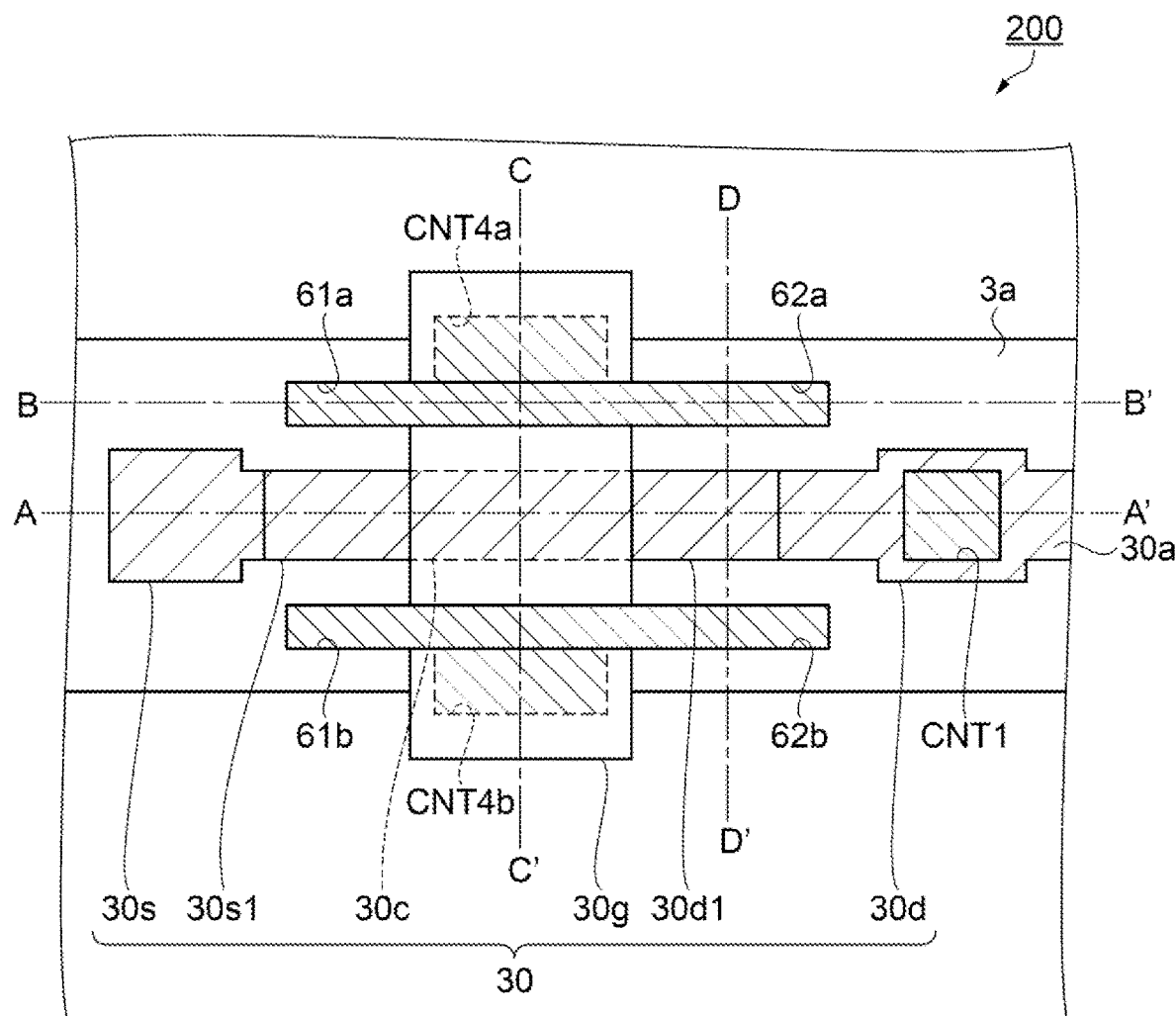
FIG. 24 is a plan view illustrating a configuration of a transistor according to a second embodiment.
Figure 25:
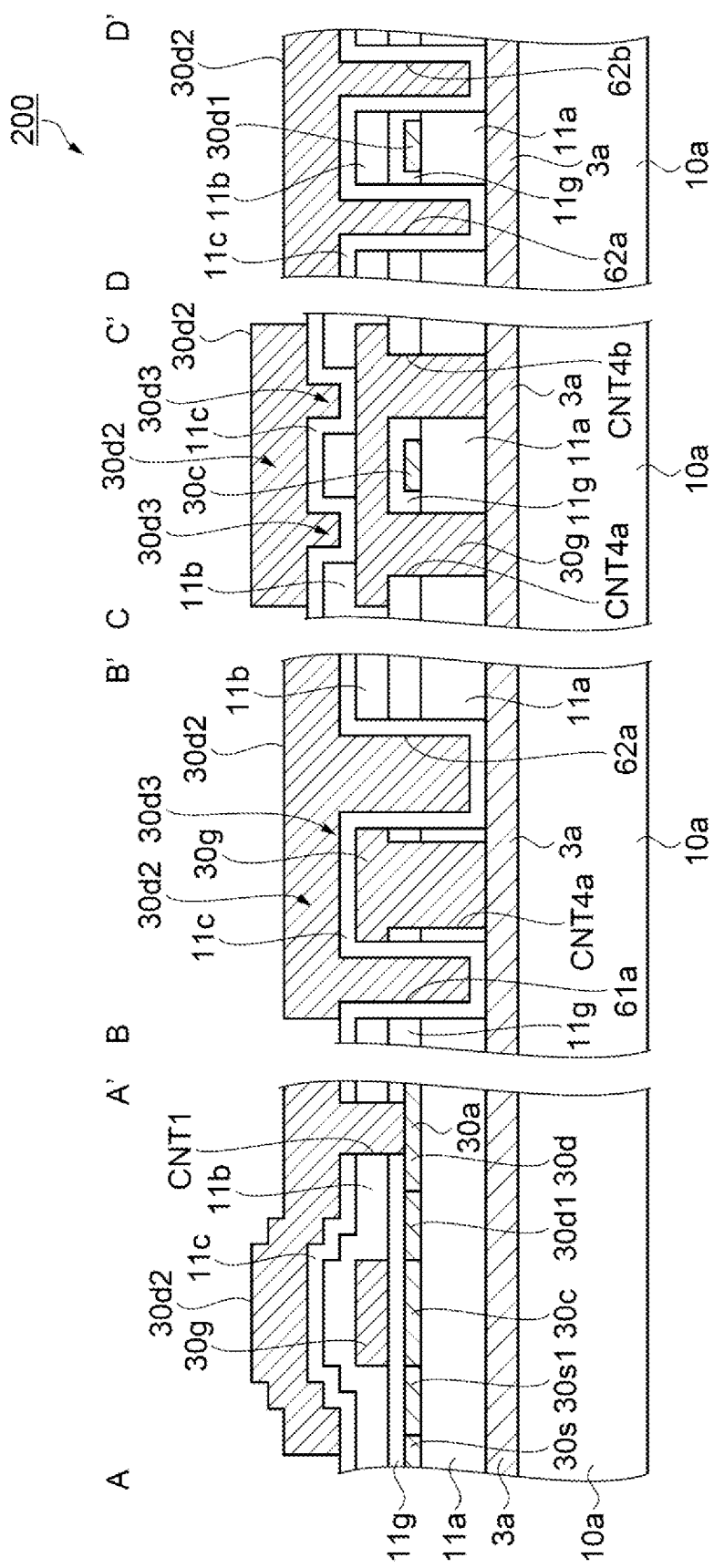
FIG. 25 is a cross-sectional view illustrating a configuration of the transistor illustrated in FIG. 24.

A liquid crystal device 200 according to the second embodiment differs from the liquid crystal device 100 according to the first embodiment in that a portion of the relay wiring line 30d2 or a light shielding portion 30d3 including other light shielding material is disposed above the gate electrode 30g, as illustrated in FIGS. 24 and 25. Other configurations are generally similar. Thus, in the second embodiment, portions differing from those of the first embodiment will be described in detail, and explanation of other overlapping portions will not be repeated as appropriate.

As in the first embodiment, the liquid crystal device 200 according to the second embodiment includes the first insulating layer 11a, the semiconductor layer 30a, the gate insulation layer 11g, the gate electrode 30g, the second insulating layer 11b, the third insulating layer 11c, and the relay wiring line 30d2, which are disposed above the first base member 10a.

Note that two openings 63a and 63b are provided in the second insulating layer 11b above the gate electrode 30g, as illustrated in the cross-sectional view taken along the C-C' line in FIG. 25. A portion of the relaying wiring line 30d2, a plug, or other metal materials having a light shielding property is disposed within these two openings 63a and 63b, whereby two light shielding portions 30d3 are disposed. Specifically, the light shielding portion 30d3 is disposed in a state of being insulated from the gate electrode 30g through the third insulating layer 11c, as illustrated in the cross-sectional views taken along the B-B' line and the C-C' line in FIG. 25.

With such a structure being provided, it is possible to further improve the light shielding property particularly between the relay wiring line 30d2 and the gate electrode 30g.

Figure 26:
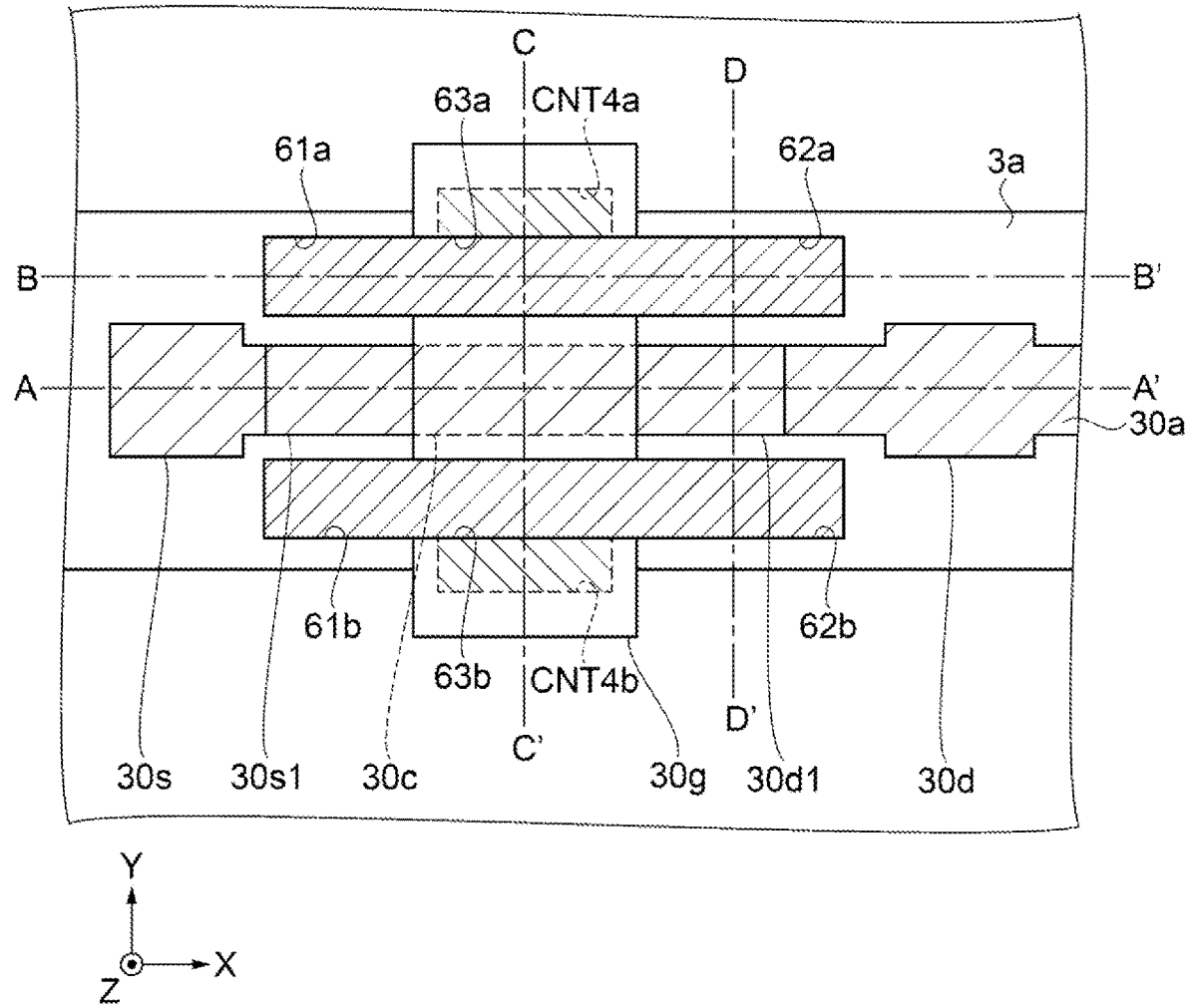
FIG. 26 is a plan view illustrating a portion of a method of manufacturing a transistor.
Figure 27:
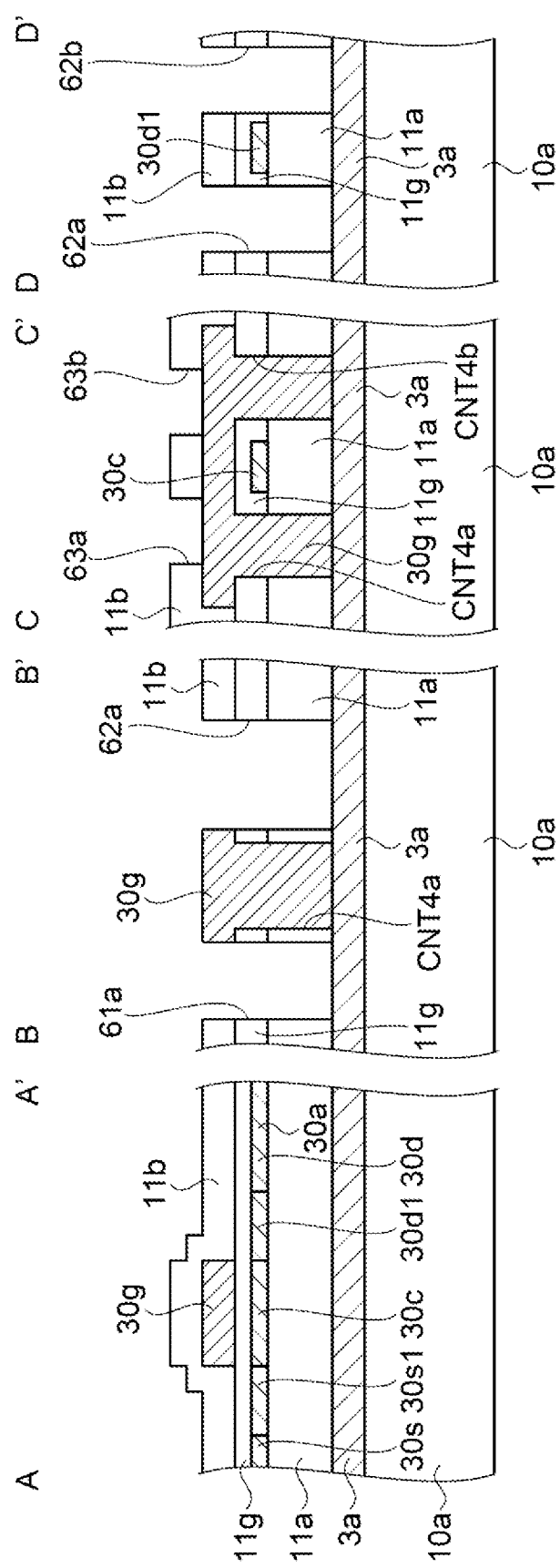
FIG. 27 is a cross-sectional view illustrating a portion of a method of manufacturing a transistor.

Next, a method of manufacturing the liquid crystal device 200 according to the second embodiment will be described with reference to FIGS. 26 to 31. FIG. 26 is a plan view illustrating a configuration of a peripheral portion including the transistor 30 that constitutes the pixel P. FIG. 27 is a cross-sectional view taken along each line in the peripheral portion including the transistor 30 that constitutes the pixel P illustrated in FIG. 26. After this, FIGS. 28 to 31 are plan views and cross-sectional views similar to those described above.

The steps for forming the films from the first base member 10a to the second insulating layer 11b are similar to those in the first embodiment. In the method of manufacturing the liquid crystal device 200 according to the second embodiment, the openings 63a and 63b are formed in the second insulating layer lib, as illustrated in FIGS. 26 and 27. Specifically, for example, the openings 63a and 63b having widths equal to the opening 61a and the opening 61b are formed in the second insulating layer 11b formed above the gate electrode 30g, as illustrated in the cross-sectional view taken along the C-C' line in FIG. 27.

Figure 28:
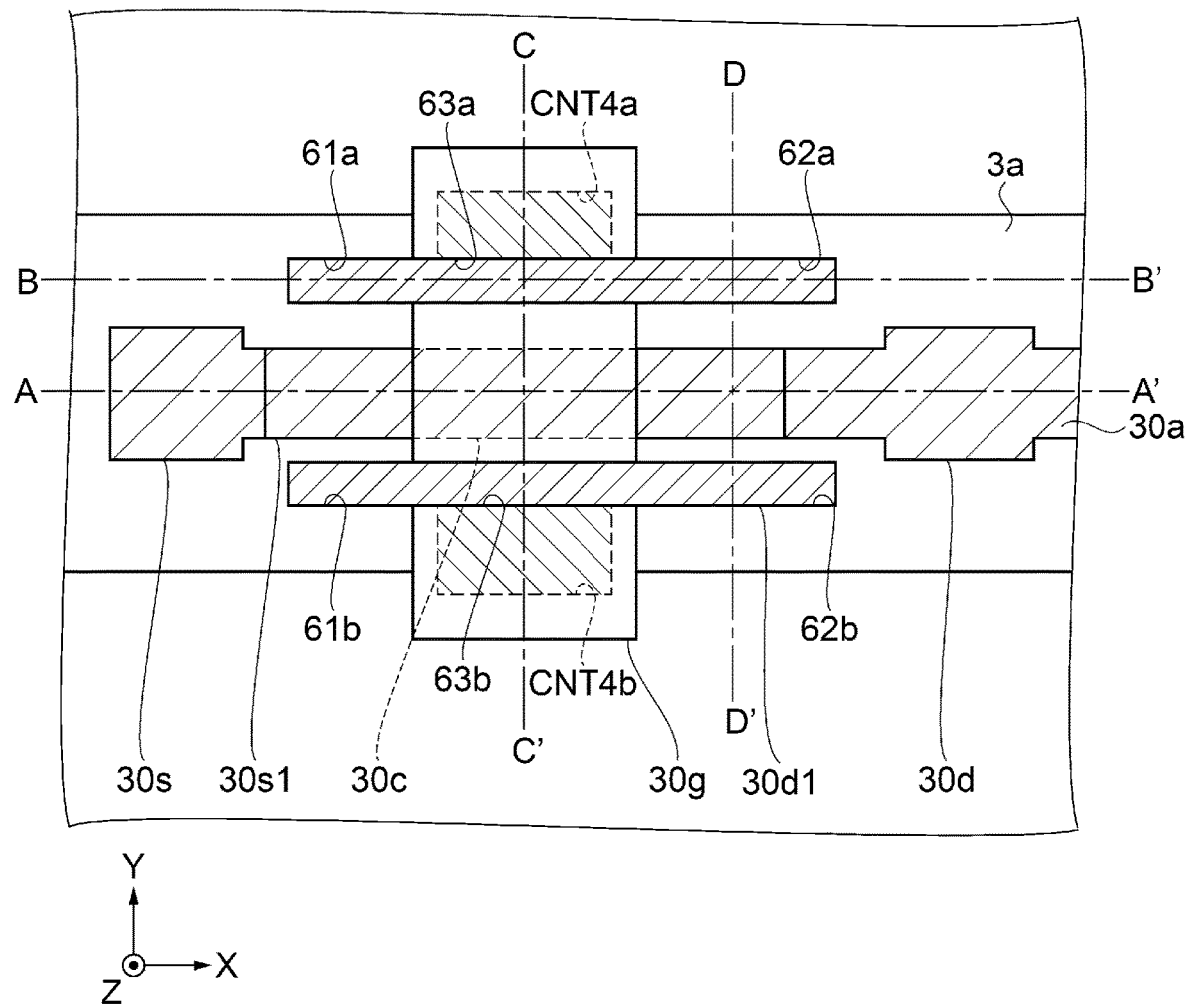
FIG. 28 is a plan view illustrating a portion of a method of manufacturing a transistor.
Figure 29:
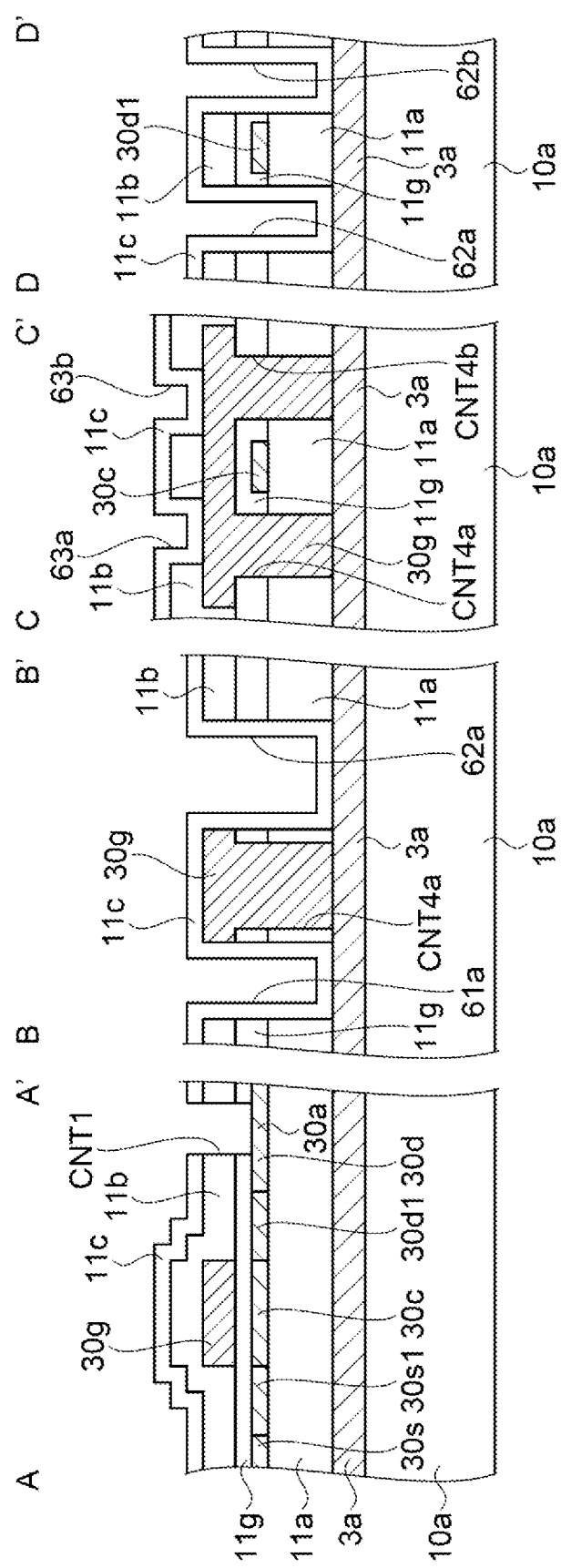
FIG. 29 is a cross-sectional view illustrating a portion of a method of manufacturing a transistor.

Next, as illustrated in FIGS. 28 and 29, the third insulating layer 11c is formed above the exposing surfaces of the openings 61a, 61b, 62a, 62b, 63a, and 63b and also above the second insulating layer 11b to form the contact hole CNT1.

Figure 30:
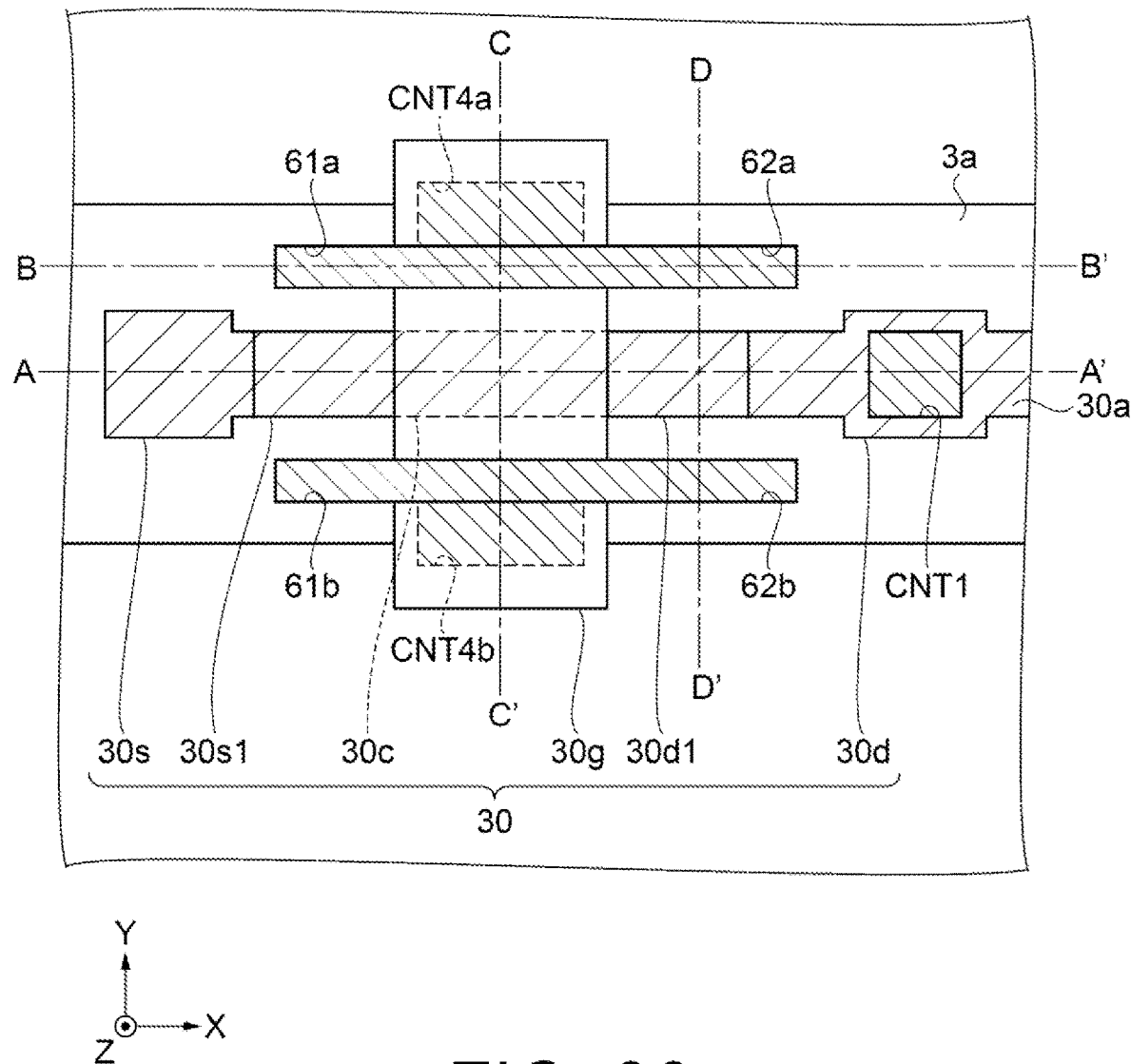
FIG. 30 is a plan view illustrating a portion of a method of manufacturing a transistor.
Figure 31:
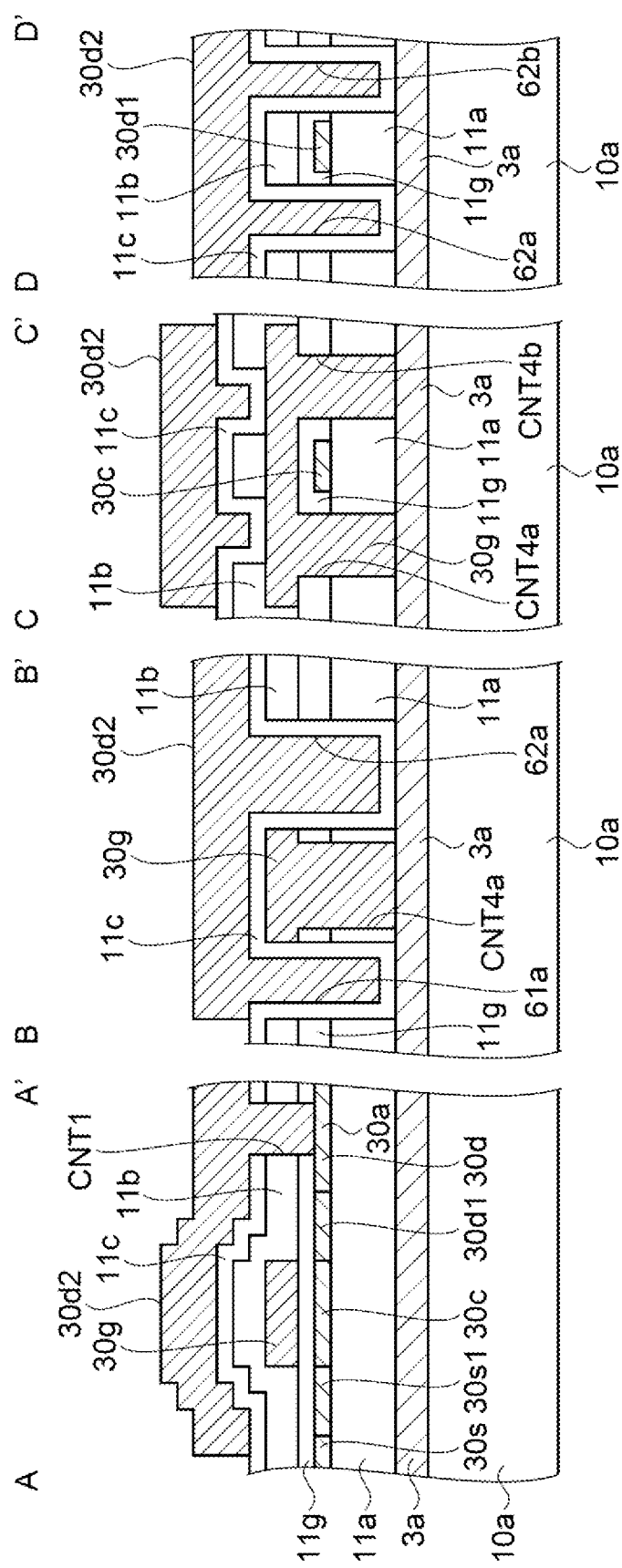
FIG. 31 is a cross-sectional view illustrating a portion of a method of manufacturing a transistor.

Next, as illustrated in FIGS. 30 and 31, for example, a film of aluminum is formed in the openings 61a, 61b, 62a, 62b, 63a, and 63b and above the third insulating layer 11c, and then, patterning is performed to complete the relay wiring line 30d2 and the openings 61a, 61b, 62a, 62b, 63a, and 63b.

Note that the configuration of the relay wiring line 30d2 described above is not limited to that electrically coupled to the drain region 30d. It may be possible that the relay wiring line 30d2 is electrically coupled to a wiring line to which a constant potential is applied. For example, the wiring line to which a constant potential is applied includes the capacitance line 3b. With this configuration, the relay wiring line 30d2 is used for a constant potential, that is, a common potential. Thus, it is possible to suppress the influence on the property of the transistor. In addition, the relay wiring line 30d2 may be electrically coupled to the source area 30s.

Note that, as in the embodiments described above, the openings 61a, 61b, 62a, and 62b are used to shield both the first LDD region 30d1 and the second LDD region 30s1 from light. However, it may be possible to employ a structure in which the openings 62a and 62b are used to only shield the first LDD region 30d1 from light.

The configuration of each of the openings 62a and 62b is not limited to that disposed at sides of the first LDD region 30d1. It is preferable that these are disposed so as to continue from the first LDD region 30d1 to the side of the drain region 30d. This configuration makes it possible to further improve the light shielding property of the first LDD region 30d1. Note that this similarly applies to the second LDD region 30s1.

It is preferable that the width of the relay wiring line 30d2 is wider than the width of the scanning line 3a. With this configuration, when the light enters from the counter substrate 20 side, it is possible to improve the light shielding property of the first LDD region 30d1 and the second LDD region 30s1.

What is claimed is:
1. An electro-optical device comprising:
 a base member;
 a scanning line extending along a first direction and having a light shielding property;
 a transistor including:
  a semiconductor layer extending along the first direction so as to overlap with the scanning line; and
  a gate electrode including
   a first light shielding portion provided at a side of a channel region of the semiconductor layer; and
 a relay layer electrically connected to the transistor, the relay layer including:
  a body portion provided so as to overlap with the transistor in plan view; and
  a second light shielding portion protruding from the body portion through a side of an LDD region of the semiconductor layer toward the base member side.
2. The electro-optical device according to claim 1, wherein
 the first light shielding portion extends in the first direction along the channel region, and
 the second light shielding portion extends in the first direction along the LDD region.
3. The electro-optical device according to claim 1, wherein
 the semiconductor layer includes one LDD region disposed between the channel region and one source drain region, and another LDD region disposed between the channel region and another source drain region, and a space between the second light shielding portion and the one LDD region is equal to a space between the second light shielding portion and the other LDD region.

4. The electro-optical device according to claim 1 comprising:

a source drain electrode electrically coupled to one source drain region of the semiconductor layer, wherein the second light shielding portion includes a portion of the source drain electrode.

5. The electro-optical device according to claim 1, comprising:

a capacitance line to which a constant potential is applied; and a relay wire electrically coupled to the capacitance line.

6. The electro-optical device according to claim 1 comprising:

a first insulating layer disposed between the scanning line and the transistor; and a second insulating layer covering the transistor, wherein the second light shielding portion is provided within an opening extending through the first insulating layer and the second insulating layer.

7. The electro-optical device according to claim 1 comprising:

a pixel electrode, wherein the relay layer is electrically coupled to the pixel electrode, wherein the scanning line and the relay layer each include:

a main body portion that extends in the first direction; and a protrusion that protrudes in a second direction intersecting the first direction so that the protrusion overlaps the first light shielding portion, and the second light shielding portion is disposed within an opening provided at each side of the protrusion in plan view.

8. The electro-optical device according to claim 6 comprising:

an insulating member provided within the opening and between the scanning line and the second light shielding portion.

9. The electro-optical device according to claim 3, wherein the second light shielding portion is provided along the one LDD region and the one source drain region.

10. An electronic device comprising:

the electro-optical device according to claim 1.

11. The electro-optical device according to claim 1 comprising:

an insulating layer covering the transistor, wherein the first light shielding portion is provided in a first layer between the insulating layer and the semiconductor layer of the transistor, and the second light shielding portion is provided in a second layer on an opposite side of the insulating layer from the first light shielding portion.

12. The electro-optical device according to claim 1 comprising:

an insulating member provided between the scanning line and the second light shielding portion, wherein a distance between the scanning line and the second light shielding portion is equal to a thickness of the insulating member.

13. An electro-optical device comprising:

a base member;

a scanning line extending along a first direction and having a light shielding property;

a transistor including:

a semiconductor layer extending along the first direction so as to overlap with the scanning line; and a gate electrode including a first light shielding portion provided at a side of a channel region of the semiconductor layer; and a light shielding member including:

a body portion provided so as to overlap with the transistor in plan view; and a second light shielding portion protruding from the body portion through a side of an LDD region of the semiconductor layer toward the base member side.

14. The electro-optical device according to claim 1, wherein the second light shielding portion is provided at two opposite sides of the LDD region of the semiconductor layer and spaced apart from the scanning line.

15. The electro-optical device according to claim 1 comprising:

an insulating member provided between the scanning line and the second light shielding portion, wherein the insulating member is in contact with the second light shielding portion.

* * * * *